United States Patent
Oya et al.

(10) Patent No.: US 11,569,424 B2
(45) Date of Patent: Jan. 31, 2023

(54) SEMICONDUCTOR DEVICE

(71) Applicant: Nuvoton Technology Corporation Japan, Kyoto (JP)

(72) Inventors: Mitsuaki Oya, Tokyo (JP); Masanori Hiroki, Toyama (JP); Keimei Masamoto, Niigata (JP); Shigeo Hayashi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/123,078

(22) Filed: Dec. 15, 2020

(65) Prior Publication Data
US 2021/0104652 A1    Apr. 8, 2021

Related U.S. Application Data

(63) Continuation of application No. PCT/JP2019/046029, filed on Nov. 25, 2019.

(30) Foreign Application Priority Data

Dec. 14, 2018   (JP) .............................. JP2018-234349

(51) Int. Cl.
  *H01L 33/62*     (2010.01)
  *F21S 43/14*     (2018.01)
  (Continued)

(52) U.S. Cl.
  CPC ............. *H01L 33/62* (2013.01); *F21S 41/141* (2018.01); *F21S 43/14* (2018.01); *F21W 2103/55* (2018.01); *H01L 2933/0066* (2013.01)

(58) Field of Classification Search
  CPC ............. H01L 33/62; H01L 2933/0066; H01L 33/0093; H01L 2224/14; H01L 2224/17; F21S 41/141; F21S 43/14; F21W 2103/55
  See application file for complete search history.

(56) References Cited

U.S. PATENT DOCUMENTS 3,872,418 A * 3/1975 Plough .................. H01C 7/047
                                                338/23
5,639,696 A * 6/1997 Liang ................ H01L 23/49816
                                                228/180.22
(Continued)

FOREIGN PATENT DOCUMENTS

JP   H05-152381 A   6/1993
JP   2000-223634 A  8/2000
(Continued)

OTHER PUBLICATIONS

International Search Report issued in corresponding International (PCT) Application No. PCT/JP2019/046029, dated Feb. 10, 2020, with English translation.

(Continued)

*Primary Examiner* — Su C Kim
(74) *Attorney, Agent, or Firm* — McDermott Will & Emery LLP

(57) ABSTRACT

A semiconductor device includes: a first electrode provided on a semiconductor multilayer structure; a second electrode provided on a substrate; and a bonding metal layer which bonds the first electrode and the second electrode together. The bonding metal layer includes a gap inside.

11 Claims, 25 Drawing Sheets

(51) Int. Cl.
*F21W 103/55* (2018.01)
*F21S 41/141* (2018.01)

(56) References Cited

U.S. PATENT DOCUMENTS

| | | | |
|---|---|---|---|
| 5,668,386 A * | 9/1997 | Makiuchi | H01L 27/1465 |
| | | | 257/745 |
| 6,122,177 A * | 9/2000 | Kitano | H01L 23/49816 |
| | | | 361/783 |
| 2004/0150082 A1 | 8/2004 | Kajiwara et al. | |
| 2006/0049335 A1 | 3/2006 | Suehiro et al. | |
| 2007/0012938 A1 | 1/2007 | Yu et al. | |
| 2013/0065331 A1 | 3/2013 | Koyama et al. | |
| 2015/0349225 A1* | 12/2015 | Oh | H01L 33/62 |
| | | | 257/99 |
| 2016/0118552 A1* | 4/2016 | Kim | H01L 33/502 |
| | | | 438/7 |
| 2016/0218259 A1* | 7/2016 | Yamada | H01L 33/56 |
| 2017/0133567 A1* | 5/2017 | Fukasawa | H01L 33/62 |
| 2017/0278816 A1* | 9/2017 | Li | H01L 21/4867 |
| 2018/0151523 A1 | 5/2018 | Chen et al. | |

FOREIGN PATENT DOCUMENTS

| | | |
|---|---|---|
| JP | 2006-128457 A | 5/2006 |
| JP | 4-137630 B2 | 8/2008 |
| JP | 2011-9429 A | 1/2011 |
| JP | 2011-204838 A | 10/2011 |
| JP | 2012-049296 A | 3/2012 |
| JP | 2015-008272 A | 1/2015 |
| JP | 2017-112289 A | 6/2017 |
| JP | 2017-212266 A | 11/2017 |
| JP | 2018-067681 A | 4/2018 |
| JP | 2019-096783 A | 6/2019 |
| WO | 2009/063638 A1 | 5/2009 |
| WO | 2020/121793 A1 | 6/2020 |

OTHER PUBLICATIONS

Decision to Grant a Patent issued in corresponding Japanese Patent Application No. 2020-526337, dated Aug. 4, 2020, with English translation.
Extended European Search Report dated Dec. 6, 2021, issued in corresponding European Patent Application No. 19895065.1.

* cited by examiner

M CROSS SECTION

SEMICONDUCTOR DEVICE

CROSS REFERENCE TO RELATED APPLICATIONS

This application is a U.S. continuation application of PCT International Patent Application Number PCT/JP2019/046029 filed on Nov. 25, 2019, claiming the benefit of priority of Japanese Patent Application Number 2018-234349 filed on Dec. 14, 2018, the entire contents of which are hereby incorporated by reference.

BACKGROUND

1. Technical Field

The present disclosure relates to semiconductor devices.

2. Description of the Related Art

Semiconductor light-emitting elements such as light-emitting diodes (LEDs) are used as light sources for various devices. For example, the LEDs are used as vehicle-mounted light sources for vehicle-mounted lighting devices such as daytime running lights (DRLs) and headlamps (HLs). In particular, the market is growing for vehicle-mounted light sources including high-power LEDs with at least 1-watt light output, leading to a rapid increase in replacement of halogen lamps and high-intensity discharge (HID) lamps with LEDs.

For the vehicle-mounted light sources, there are increasing demands for saving space and design improvement, and thus the LEDs are becoming more compact and integrated with larger electric current. Consequently, it is important to dissipate heat generated at the LEDs to secure the reliability required for the LEDs.

As a technique for bonding a semiconductor chip such as an LED chip and a mounting substrate together to make the semiconductor chip more compact and integrated with larger electric current, the flip-chip bonding for bonding the semiconductor chip face down to the mounting substrate is known. In this technique, the semiconductor chip is flipped (turned upside down) so that an electrode of the mounting substrate and an electrode of the semiconductor chip are directly bonded together using a metal bump, meaning that this technique is less dependent on the wire diameter or the wire routing than in the case where the semiconductor chip is bonded to the mounting substrate by a face-up method for wiring the semiconductor chip with its electrode forming surface directed upward; thus, the flip-chip bonding is suitable for highly integrated semiconductor chips with large electric current and therefore is used for vehicle-mounted light sources as a mounting method for high-output applications.

A conventional semiconductor device of this type is disclosed in Japanese Unexamined Patent Application Publication No. 2011-009429. Japanese Unexamined Patent Application Publication No. 2011-009429 discloses a technique for densely arranging a plurality of metal bumps between a semiconductor element and a mounting substrate at the time of bonding the semiconductor element and the mounting substrate together for the purpose of improving heat dissipation properties.

SUMMARY

However, in the semiconductor device disclosed in Japanese Unexamined Patent Application Publication No. 2011-009429, a mounting load that is placed when the semiconductor element is mounted on the mounting substrate via the discrete metal bumps is locally concentrated on the contact surface between each of the electrodes of the semiconductor element and the mounting substrate and the metal bumps, resulting in damage to the electrodes of the semiconductor element and the mounting substrate. This causes the problem of mounting damage such as electrode failures, leading to reduced long-term reliability.

The present disclosure aims to provide a semiconductor device exceptionally reliable in the long run by reducing mounting damage.

A semiconductor device according to one aspect of the present disclosure includes: a first electrode provided on a semiconductor multilayer structure; a second electrode provided on a substrate; and a bonding metal layer that bonds the first electrode and the second electrode together. The bonding metal layer includes a gap inside. The first electrode includes a p-side electrode and an n-side electrode. A proportion of an area taken up by the gap in a plan view is lower in a region close to a p-n electrode opposed portion than in a region away from the p-n electrode opposed portion. The p-n electrode opposed portion is a portion across which the p-side electrode and the n-side electrode are opposed to each other.

According to the present disclosure, the mounting damage can be reduced, and thus it is possible to provide a semiconductor device exceptionally reliable in the long run.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Embodiments

Hereinafter, embodiments of the present disclosure will be described with reference to the drawings. Note that each of the embodiments described below shows a specific example of the present disclosure. Thus, the numerical values, shapes, materials, structural elements, and the arrangement and connection of the structural elements, steps, the processing order of the steps etc., shown in the following embodiments are mere examples, and are not intended to limit the present disclosure.

Note that the figures are schematic diagrams and are not necessarily precise illustrations. Therefore, scale reduction, etc., in the figures are not necessarily the same. In the figures, substantially identical elements are assigned the same reference signs, and overlapping description will be omitted or simplified.

Embodiment 1

[Semiconductor Device]

Figure 1A:
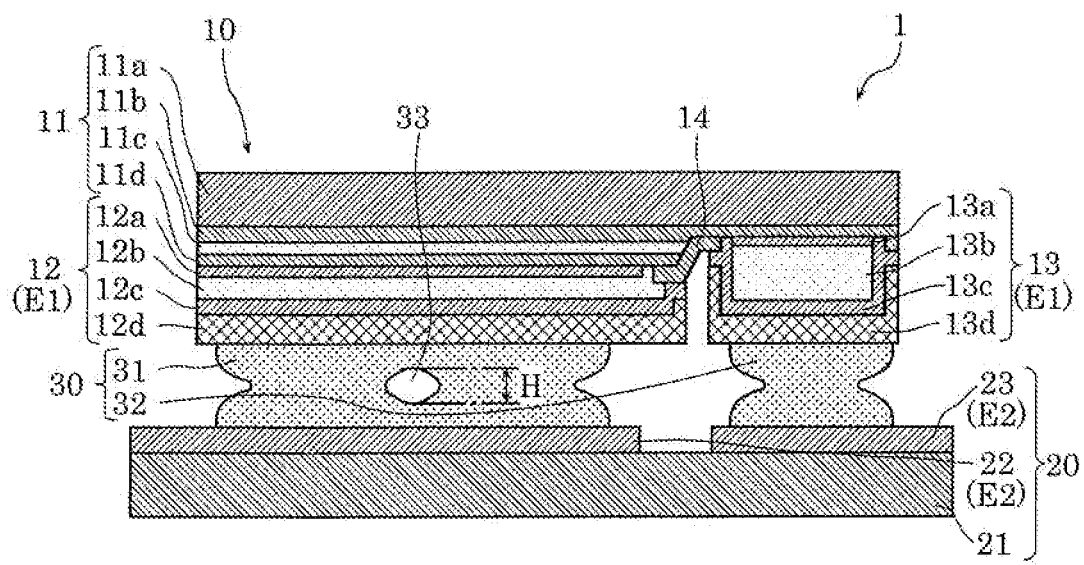
FIG. 1A is a cross-sectional view of a semiconductor device according to Embodiment 1 taken along line IA-IA in FIG. 2B.
Figure 1B:
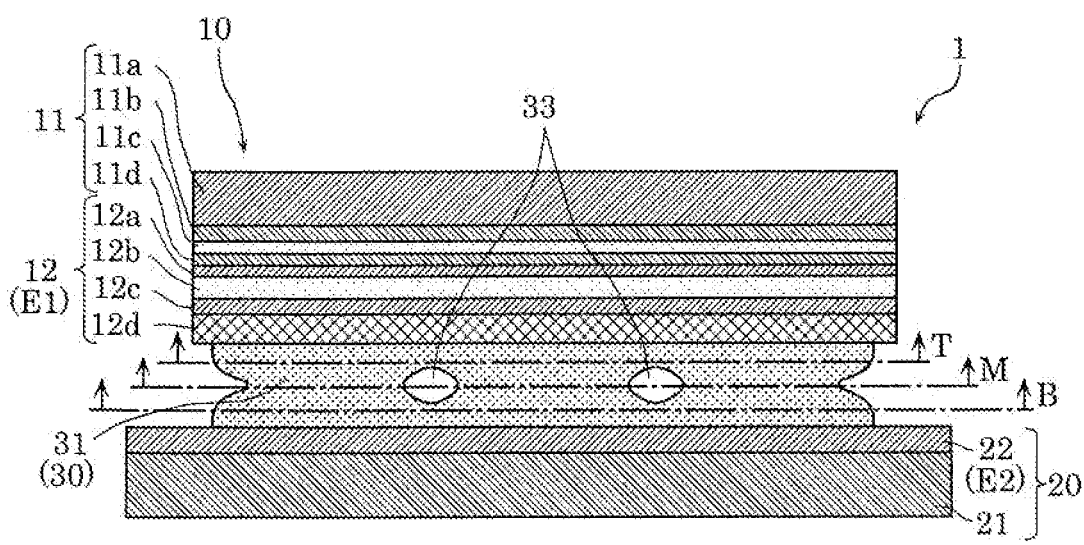
FIG. 1B is a cross-sectional view of a semiconductor device according to Embodiment 1 taken along line IB-IB in FIG. 2B.
Figure 2A:
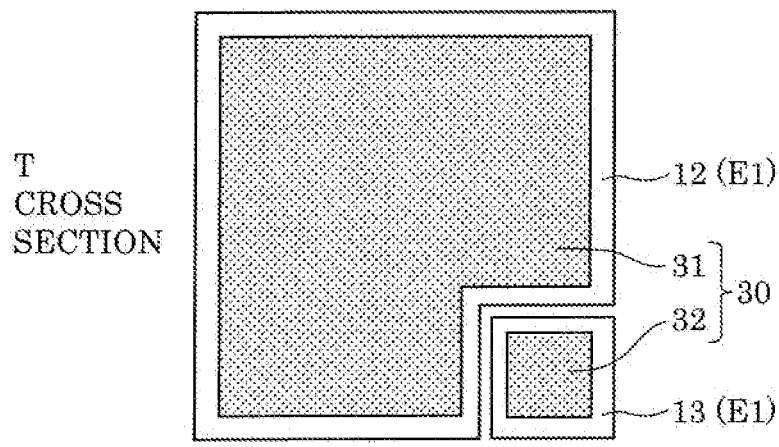
FIG. 2A is a cross-sectional view of a semiconductor device according to Embodiment 1 in a T cross section obtained when cut along dashed line T in FIG. 1B.
Figure 2B:
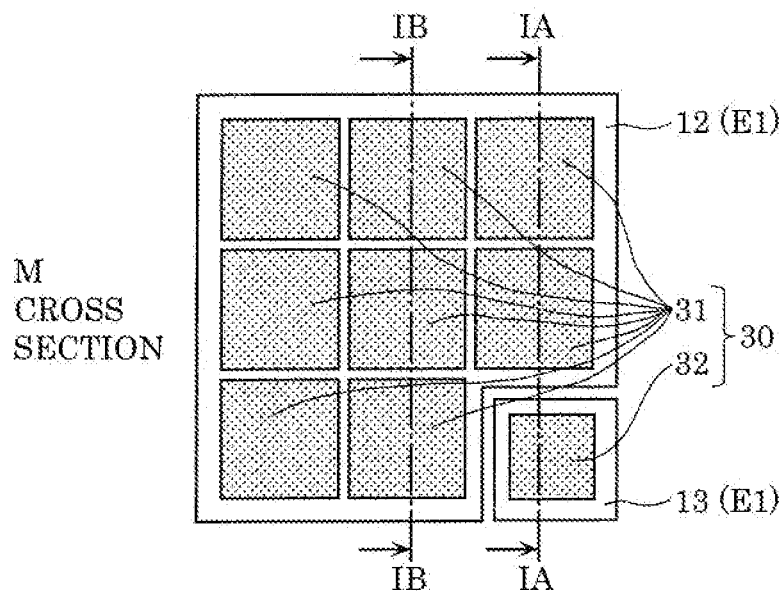
FIG. 2B is a cross-sectional view of a semiconductor device according to Embodiment 1 in an M cross section obtained when cut along dashed line M in FIG. 1B.
Figure 2C:
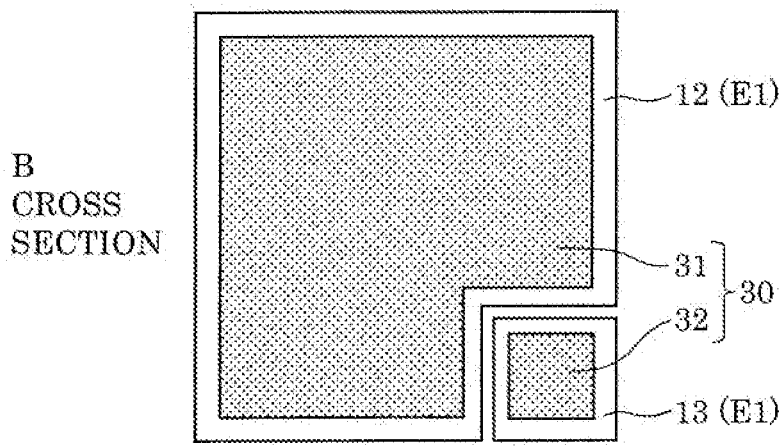
FIG. 2C is a cross-sectional view of a semiconductor device according to Embodiment 1 in a B cross section obtained when cut along dashed line B in FIG. 1B.

First, the configuration of semiconductor device 1 according to Embodiment 1 will be described with reference to FIG. 1A, FIG. 1B, and FIG. 2A to FIG. 2C. FIG. 1A and FIG. 1B are cross-sectional views of semiconductor device 1 according to Embodiment 1. FIG. 2A is a cross-sectional view of semiconductor device 1 in a T cross section obtained when cut along dashed line T in FIG. 1B. FIG. 2B is a cross-sectional view of semiconductor device 1 in an M cross section obtained when cut along dashed line M in FIG. 1B. FIG. 2C is a cross-sectional view of semiconductor device 1 in a B cross section obtained when cut along dashed line B in FIG. 1B. Note that FIG. 1A is a cross-sectional view taken along line IA-IA in FIG. 2B and FIG. 1B is a cross-sectional view taken along line IB-IB in FIG. 2B. In FIG. 2A to FIG. 2C, each of dashed lines T, M, B indicates a plane perpendicular to the thickness direction (height direction) of bonding metal layer 30. Dashed line M indicates a plane passing through gap 33 and is located between dashed line T and dashed line B.

As illustrated in FIG. 1A and FIG. 1B, semiconductor device 1 according to Embodiment 1 includes semiconductor element 10, mounting substrate 20, and bonding metal layer 30 for bonding semiconductor element 10 and mounting substrate 20 together.

Semiconductor element 10 is disposed on mounting substrate 20. Specifically, semiconductor element 10 is bonded to mounting substrate 20 via bonding metal layer 30 and is thus mounted on mounting substrate 20. In the present embodiment, semiconductor element 10 is a light-emitting diode (LED) chip. Thus, semiconductor device 1 is a semiconductor light-emitting device including the LED chip.

Semiconductor element 10 includes semiconductor multilayer structure 11 and first electrode E1 provided on semiconductor multilayer structure 11. Specifically, semiconductor element 10 includes, as first electrode E1, first p-side electrode 12 and first n-side electrode 13 formed on semiconductor multilayer structure 11. Each of first p-side electrode 12 and first n-side electrode 13 is made up of at least two layers including a surface layer made of gold in contact with bonding metal layer 30.

Note that in the present description, first p-side electrode 12 and first n-side electrode 13 may be collectively referred to as first electrode E1 when there is no need to differentiate these electrodes. In other words, first electrode E1 represents at least one of first p-side electrode 12 and first n-side electrode 13.

Semiconductor multilayer structure 11 includes substrate 11a, n-type semiconductor layer 11b (first conductivity-type semiconductor layer), active layer 11c, and p-type semiconductor layer 11d (second conductivity-type semiconductor layer). N-type semiconductor layer 11b, active layer 11c, and p-type semiconductor layer 11d constitute a semiconductor layered body in contact with substrate 11a and are stacked in the stated order from substrate 11a. Specifically, n-type semiconductor layer 11b, active layer 11c, and p-type semiconductor layer 11d are stacked on substrate 11a in the stated order in a direction away from substrate 11a.

First p-side electrode 12 and first n-side electrode 13 are formed on semiconductor multilayer structure 11. First p-side electrode 12 is formed on p-type semiconductor layer 11d. First n-side electrode 13 is formed on n-type semiconductor layer 11b. Specifically, first n-side electrode 13 is formed in an exposed region that is a portion of n-type semiconductor layer 11b exposed by removing a portion of each of p-type semiconductor layer 11d and active layer 11c.

In the present embodiment, oxide film 14 is formed on semiconductor multilayer structure 11 as an insulating film. First p-side electrode 12 is formed on p-type semiconductor layer 11d exposed in an opening of oxide film 14, and first n-side electrode 13 is formed on n-type semiconductor layer 11b exposed in an opening of oxide film 14.

First p-side electrode 12 includes reflective electrode 12a, barrier electrode 12b, seed layer 12c, and cover electrode 12d stacked sequentially from semiconductor multilayer structure 11. Specifically, reflective electrode 12a, barrier electrode 12b, seed layer 12c, and cover electrode 12d are stacked on semiconductor multilayer structure 11 in the stated order. In first p-side electrode 12, reflective electrode 12a, which is a metal film that reflects light from active layer 11c of semiconductor multilayer structure 11, is disposed in contact with p-type semiconductor layer 11d (second conductivity-type semiconductor layer) of semiconductor multilayer structure 11.

First n-side electrode 13 includes ohmic contact layer 13a, barrier electrode 13b, seed layer 13c, and cover electrode 13d stacked sequentially from semiconductor multilayer structure 11.

In first p-side electrode 12 and first n-side electrode 13, cover electrodes 12d, 13d are surface layers made of gold in contact with bonding metal layer 30. Specifically, cover electrodes 12d, 13d are gold-plated films formed using seed layers 12c, 13c as undercoat layers.

Mounting substrate 20 includes substrate 21 and second electrode E2 provided on substrate 21. Specifically, mounting substrate 20 includes, as second electrode E2, second p-side electrode 22 and second n-side electrode 23 formed on one surface of substrate 21. Each of second p-side electrode 22 and second n-side electrode 23 is a lead-out electrode for passing an electric current to semiconductor element 10.

Second p-side electrode 22 is bonded to first p-side electrode 12 of semiconductor element 10 via bonding metal layer 30. The same applies to the n side; second n-side electrode 23 is bonded to first n-side electrode 13 of semiconductor element 10 via bonding metal layer 30.

Note that in the present description, second p-side electrode 22 and second n-side electrode 23 may be collectively referred to as second electrode E2 when there is no need to differentiate these electrodes. In other words, second electrode E2 represents at least one of second p-side electrode 22 and second n-side electrode 23.

Bonding metal layer 30 bonds semiconductor element 10 and mounting substrate 20 together. In other words, bonding metal layer 30 joins semiconductor element 10 and mounting substrate 20 together. Specifically, bonding metal layer 30 connects first electrode E1 provided on semiconductor multilayer structure 11 and second electrode E2 provided on substrate 21.

In the present embodiment, bonding metal layer 30 includes first bonding metal layer 31 and second bonding metal layer 32. First bonding metal layer 31 is located between first p-side electrode 12 of semiconductor element 10 and second p-side electrode 22 of mounting substrate 20 and bonds first p-side electrode 12 and second p-side electrode 22 together. Second bonding metal layer 32 is located between first n-side electrode 13 of semiconductor element 10 and second n-side electrode 23 of mounting substrate 20 and bonds first n-side electrode 13 and second n-side electrode 23 together.

First bonding metal layer 31 and second bonding metal layer 32 include the same material. In the present embodiment, each of first bonding metal layer 31 and second bonding metal layer 32 is formed of a gold-plated film.

As illustrated in FIG. 1A, FIG. 1B, and FIG. 2A to FIG. 2C, there is gap 33 inside bonding metal layer 30. Gap 33 is present surrounded by bonding metal layer 30 along the perimeter. Specifically, gap 33 is present in bonding metal layer 30 in such a manner as to be embedded in bonding metal layer 30 without contacting first electrode E1 or second electrode E2. In the present embodiment, gap 33 is present in first bonding metal layer 31, does not contact first p-side electrode 12 or first n-side electrode 13, and is located in the vicinity of a center portion of first bonding metal layer 31 in the thickness direction. Gap 33 is a hollow cavity in the present embodiment. Thus, gap 33 is a layer of air, meaning that air exists in gap 33.

As illustrated in FIG. 2B, gap 33 extends linearly along the outer side of first electrode E1 in a plan view of bonding metal layer 30. Specifically, gap 33 is parallel to the outer side of first electrode E1. In the present embodiment, gap 33 is formed in a grid pattern. As illustrated in FIG. 1A, height H of gap 33 may be at least 10% of the height of bonding metal layer 30. Note that the upper limit of height H of gap 33 is not particularly limited and, for example, may be 90%.

Although details will be described later, bonding metal layer 30 is formed as a result of a plurality of metal bumps between semiconductor element 10 and mounting substrate 20 being connected to each other when semiconductor element 10 is mounted on mounting substrate 20. At this time, gap 33 is formed inside bonding metal layer 30. In other words, gap 33 is formed when semiconductor element 10 is mounted on mounting substrate 20 via the plurality of metal bumps. Hereinafter, a method for manufacturing semiconductor device 1 including a process in which gap 33 is formed will be described in detail.

[Method for Manufacturing Semiconductor Device]

The method for manufacturing semiconductor device 1 according to Embodiment 1 includes: a first step (FIG. 3A and FIG. 3B) for forming semiconductor multilayer structure 11 of semiconductor element 10; a second step (FIG. 4A to FIG. 4I) for forming the first electrode of semiconductor element 10; a third step (FIG. 5A to FIG. 5E) for forming metal bump 30Y on semiconductor element 10; and a fourth step (FIG. 6A and FIG. 6B) for mounting semiconductor element 10 on mounting substrate 20 by flip-chip bonding.

[First Step (Step for Forming Semiconductor Multilayer Structure)]

Figure 3A:
FIG. 3A is a diagram illustrating the process of preparing a substrate in a first step in a method for manufacturing a semiconductor device according to Embodiment 1.
Figure 3B:
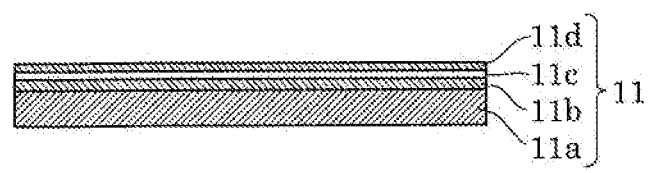
FIG. 3B is a diagram illustrating the process of forming a multilayer semiconductor structure in a first step in a method for manufacturing a semiconductor device according to Embodiment 1.

First, semiconductor multilayer structure 11 of semiconductor element 10 is formed according to the flow illustrated in FIG. 3A and FIG. 3B. FIG. 3A and FIG. 3B are diagrams illustrating the flow for forming semiconductor multilayer structure 11 of semiconductor element 10.

Specifically, as illustrated in FIG. 3A, substrate 11a is prepared first. In the present embodiment, a wafer made of GaN (GaN substrate) is used for substrate 11a as a light-transmissive substrate formed of a semiconductor.

Next, as illustrated in FIG. 3B, n-type semiconductor layer 11b, active layer 11e, and p-type semiconductor layer 11d are sequentially stacked on substrate 11a by the metalorganic vapor-phase epitaxy (MOVPE) to form semiconductor multilayer structure 11.

In the present embodiment, n-type semiconductor layer 11b is an n-type nitride semiconductor layer (for example, a GaN layer), active layer 11e is a nitride semiconductor light-emitting layer, and p-type semiconductor layer 11d is p-type nitride semiconductor layer. The nitride semiconductor light-emitting layer constituting active layer 11e contains at least Ga and N and an appropriate amount of In is added thereto as necessary so that a desired light-emission wavelength can be obtained. In the present embodiment, active layer 11c is an InGaN layer, and the composition ratio of In is set so that active layer 11c has a light-emission peak wavelength of 450 nm.

[Second Step (Step for Forming First Electrode)]

Next, first electrode E1 (first p-side electrode 12, first n-side electrode 13) of semiconductor element 10 is formed according to the flow illustrated in FIG. 4A to FIG. 4I. FIG. 4A to FIG. 4I are diagrams illustrating the flow for forming first electrode E1 of semiconductor element 10.

Figure 4A:
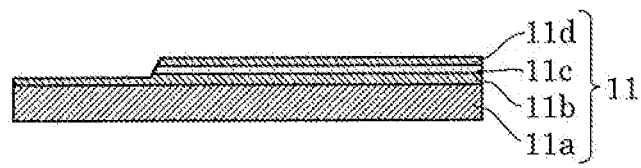
FIG. 4A is a diagram illustrating the process of etching a multilayer semiconductor structure in a second step in a method for manufacturing a semiconductor device according to Embodiment 1.

Specifically, first, as illustrated in FIG. 4A, dry etching is performed to remove p-type semiconductor layer 11d, active layer 11c, and a portion of n-type semiconductor layer 11b from semiconductor multilayer structure 11 formed in the first step described above, and thus a portion of n-type semiconductor layer 11b is exposed from p-type semiconductor layer 11d and active layer 11c. This makes it possible to form an exposed region in a portion of n-type semiconductor layer 11.

Figure 4B:
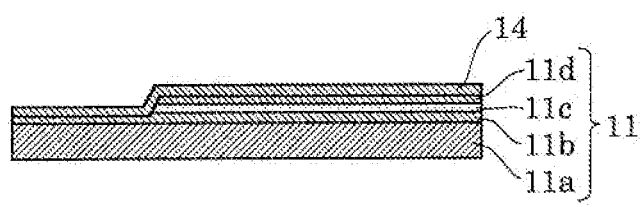
FIG. 4B is a diagram illustrating the process of forming an insulating film in a second step in a method for manufacturing a semiconductor device according to Embodiment 1.

Next, as illustrated in FIG. 4B, oxide film 14 is deposited as an insulating film on the entire upper surface of semiconductor multilayer structure 11 including the exposed region of n-type semiconductor layer 11b.

Thereafter, although not illustrated in the drawings, a resist is applied to oxide film 14, an opening is formed in the resist by photolithography at a position corresponding to the exposed region of n-type semiconductor layer 11b, and oxide film 14 in the opening of the resist is removed by etching using hydrofluoric acid.

Figure 4C:
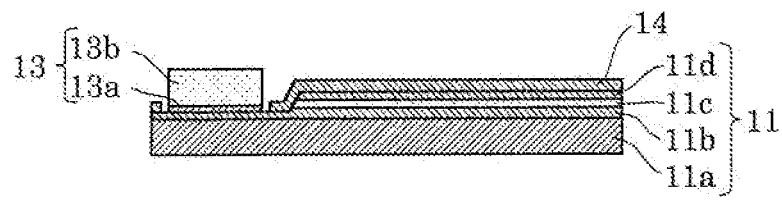
FIG. 4C is a diagram illustrating the process of forming an ohmic contact layer and a barrier electrode of a first n-side electrode in a second step in a method for manufacturing a semiconductor device according to Embodiment 1.

Next, an n-side electrode forming material for forming first n-side electrode 13 of first electrode E1 is deposited by the electron-beam (EB) evaporation, the resist and an excess of the n-side electrode forming material are removed by the resist lift-off process, and thus a portion of first n-side electrode 13 is formed in a region from which oxide film 14 has been removed, as illustrated in FIG. 4C.

In the present embodiment, as the n-side electrode forming material, an Al layer (having a thickness of 0.3 μm) that is to become ohmic contact layer 13a and a Ti layer (having a thickness of 0.1 μm) that is to become barrier electrode 13b are deposited in ascending order of distance from n-type semiconductor layer 11b. Thus, as a portion of first n-side electrode 13, laminated layers of ohmic contact layer 13a formed of the Al layer and barrier electrode 13b formed of the Ti layer can be formed.

Note that the Al layer of the first n-side electrode 13 directly stacked on n-type semiconductor layer 11b functions as an ohmic contact layer for n-type semiconductor layer 11b. The material of the ohmic contact layer can be, for example, Ti, V, Al, or an alloy containing at least one of these metals. Furthermore, the Ti layer used in barrier electrode 13b functions as a barrier for preventing reaction between the lower layer, i.e., the Al layer, and the upper layer i.e., an Au layer, to be formed in a subsequent step.

Thereafter, although not illustrated in the drawings, a resist is applied so as to cover first n-side electrode 13 and oxide film 14, an opening is formed in the resist of p-type semiconductor layer 11d by photolithography, and oxide film 14 in the opening of the resist is removed by etching using hydrofluoric acid.

Figure 4D:
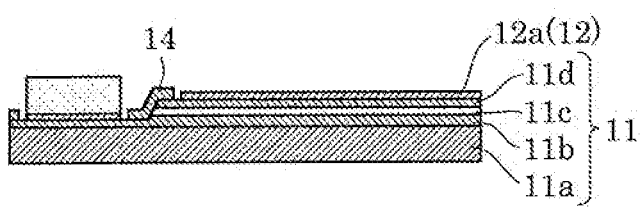
FIG. 4D is a diagram illustrating the process of forming a reflective electrode of a first p-side electrode in a second step in a method for manufacturing a semiconductor device according to Embodiment 1.

Next, a p-side electrode forming material for forming first p-side electrode 12 of first electrode E1 is deposited by the EB evaporation, the resist and an excess of the p-side electrode forming material are removed by the resist lift-off process, and thus reflective electrode 12a, which is a portion of first p-side electrode 12, is formed in a region on p-type semiconductor layer 11d from which oxide film 14 has been removed, as illustrated in FIG. 4D.

In the present embodiment, as reflective electrode 12a (p-side electrode forming material) formed of an Ag layer, an Ag layer having a thickness of 0.2 μm is deposited. At this time, reflective electrode 12a is formed apart from oxide film 14. Stated differently, reflective electrode 12a is formed so as to expose p-type semiconductor layer 11d between reflective electrode 12a and oxide film 14.

Note that a metal film made of a metal material having a high reflectivity and including Ag, Al, and Rh may be used as reflective electrode 12a in order to reflect light from active layer 11c. The method for depositing reflective electrode 12a is not limited to the EB evaporation and may be sputtering.

Figure 4E:
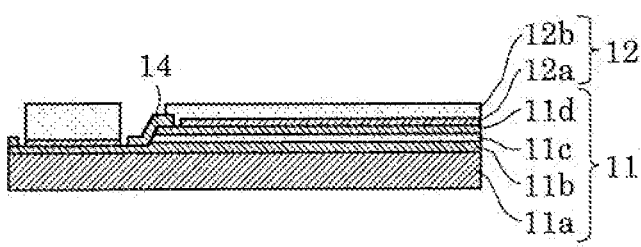
FIG. 4E is a diagram illustrating the process of forming a barrier electrode of a first p-side electrode in a second step in a method for manufacturing a semiconductor device according to Embodiment 1.

Next, as illustrated in FIG. 4E, barrier electrode 12b is formed so as to cover an upper surface and side surfaces of reflective electrode 12a. In the present embodiment, a Ti layer having a thickness of 0.8 μm is formed by sputtering as barrier electrode 12b. As the material of barrier electrode 12b, Ti, Ni, Pt, TiW, or the like may be used in order to protect reflective electrode 12a. At this time, barrier electrode 12b is formed so as to cover p-type semiconductor layer 11d exposed between oxide film 14 and reflective electrode 12a and an end of oxide film 14 that is located on n-type semiconductor layer 11b.

Figure 4F:
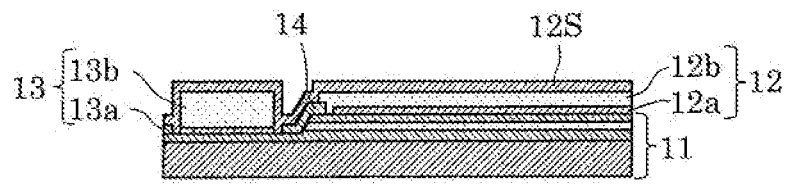
FIG. 4F is a diagram illustrating the process of forming a seed film in a second step in a method for manufacturing a semiconductor device according to Embodiment 1.

Next, as illustrated in FIG. 4F, seed film 12S is formed by the EB evaporation on the entire surface of the wafer having barrier electrode 12b of first p-side electrode 12 and barrier electrode 13b of first n-side electrode 13 formed thereon. Seed film 12S, which is a metal film that is to become seed layer 12c of first p-side electrode 12 and seed layer 13c of first n-side electrode 13, is used as a gold-plated undercoat electrode. In the present embodiment, seed film 12S is laminated layers of the Ti layer and the Au layer stacked in a direction away from barrier electrodes 12b, 13b.

Figure 4G:
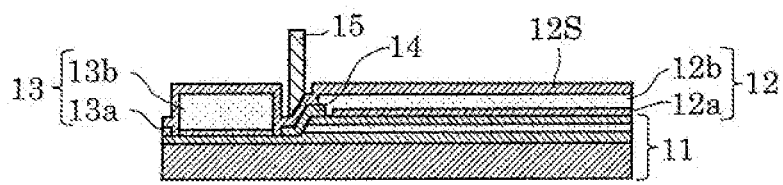
FIG. 4G is a diagram illustrating the process of forming a resist in a second step in a method for manufacturing a semiconductor device according to Embodiment 1.

Next, as illustrated in FIG. 4G, resist 15 is formed on seed film 12S in a boundary region between barrier electrode 12b corresponding to first p-side electrode 12 and barrier electrode 13b corresponding to first n-side electrode 13.

Figure 4H:
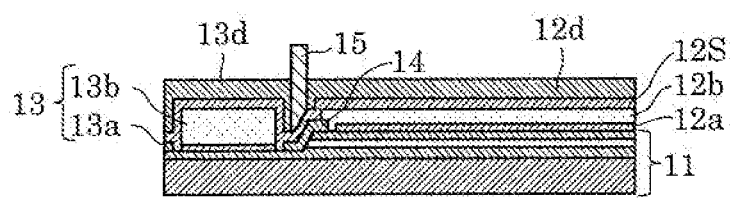
FIG. 4H is a diagram illustrating the process of forming cover electrodes of a first p-side electrode and a first n-side electrode in a second step in a method for manufacturing a semiconductor device according to Embodiment 1.

Next, as illustrated in FIG. 4H, in a region on the wafer in which resist 15 has not been formed (non-resist region), cover electrodes 12d, 13d, which are gold-plated films, are formed by metal deposition resulting from electroplating over seed film 12S as an undercoat electrode. Cover electrode 12d is formed on seed film 12S on barrier electrode 12b, and cover electrode 13d is formed on seed film 12S on barrier electrode 13b. As an example of the conditions for forming the plated films as cover electrodes 12d, 13d, a non-cyanic Au plating solution having a plating temperature of 50° C. is used, and the rate of deposition is set to 0.5 μm/min; thus, the gold-plated films having a thickness of 1.0 μm are formed as cover electrodes 12d, 13d.

Here, Au or a material containing Au is used as cover electrodes 12d, 13d in order to improve resistance to corrosion. In a plan view of semiconductor element 10 on the cover electrode 12d (cover electrode 13d) side, cover electrode 12 encapsulates barrier electrode 12b, and cover electrode 13d encapsulates barrier electrode 13b. Note that oxide film 14 is located between cover electrode 12d and cover electrode 13d on the semiconductor multilayer structure 11 side.

Figure 4I:
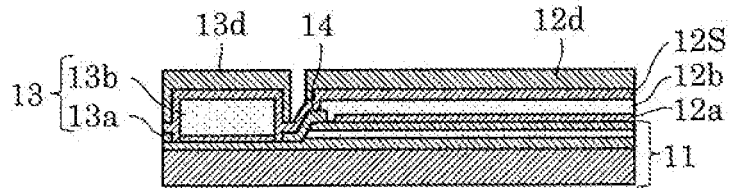
FIG. 4I is a diagram illustrating the process of removing a resist in a second step in a method for manufacturing a semiconductor device according to Embodiment 1.

Next, as illustrated in FIG. 4I, resist 15 is removed. For example, resist 15 on seed film 12S is removed using an organic solvent or the like.

[Third Step (Step for Forming Metal Bump)]

Next, metal bump 30Y is formed on semiconductor element 10 according to the flow illustrated in FIG. 5A to FIG. 5E. FIG. 5A to FIG. 5E are diagrams illustrating the flow for forming metal bump 30Y on semiconductor element 10.

Metal bump 30Y described below includes: a first bump on the p side that corresponds to first p-side electrode 12; and a second bump on the n side that corresponds to first n-side electrode 13. The first bump is formed on first p-side electrode 12, and the second bump is formed on first n-side electrode 13. In the present embodiment, metal bump 30Y is a gold-plated bump formed by gold-plating. Metal bump 30Y includes a plurality of metal layers and has a laminated structure in which at least two layers of gold-plated films having different crystal grain sizes are stacked. Hereinafter, a method for forming metal bump 30Y will be described in detail.

Figure 5A:
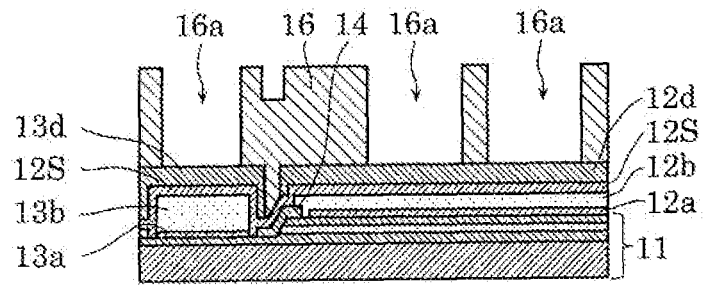
FIG. 5A is a diagram illustrating the process of forming a resist having an opening in a third step in a method for manufacturing a semiconductor device according to Embodiment 1.

After the second step described above, first, a resist for photolithography is applied so as to cover the entire surfaces of cover electrodes 12d, 13d, and the resist is cured by approximately 20-minute heat treatment at 140° C. Thereafter, as illustrated in FIG. 5A, opening 16a is formed in resist 16 in a predetermined region of first electrode E1 in which metal bump 30Y is to be formed. Specifically, a plurality of openings 16a are formed by photolithography in resist 16 in predetermined regions of cover electrode 12d of first p-side electrode 12 and cover electrode 13d of first n-side electrode 13 in which metal bumps 30Y are to be formed.

Note that in the present embodiment, nine total metal bumps 30Y are illustrated as a schematic diagram, but there are actually cases where nine or more metal bumps 30Y are formed. As one example, in semiconductor element 10 according to the present embodiment that is 800 µm square and 100 µm thick, approximately 1,000 metal bumps 30Y each in the shape of a rectangular prism having an upper rectangular surface with a side length of 25 µm may be formed. Note that the size, the shape, the number, etc., of metal bumps 30Y are not particularly limited and may be individually and specifically set according to the size of semiconductor element 10 and the area, the shape, etc., of each of first electrode E1 and second electrode E2, for example. For example, the number of metal bumps 30Y may be less than nine or may be a few tens or a few hundreds.

Figure 5B:
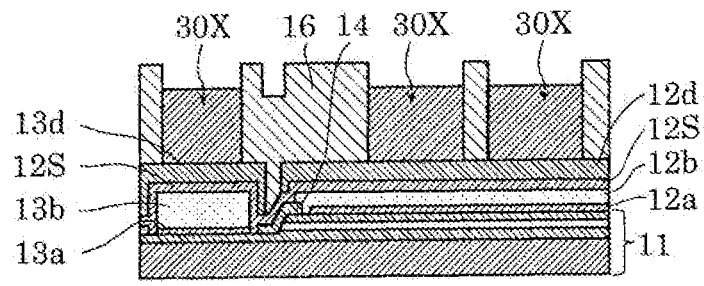
FIG. 5B is a diagram illustrating the process of forming a gold-plated film in a third step in a method for manufacturing a semiconductor device according to Embodiment 1.

Next, as illustrated in FIG. 5B, gold-plated film 30X, which is to become metal bump 30Y, is formed by metal deposition in opening 16a of resist 16 that results from gold electroplating. Specifically, gold-plated films 30X are simultaneously formed on cover electrode 12d of first p-side electrode 12 and cover electrode 13d of first n-side electrode 13 that are exposed in openings 16a of resist 16. As an example of the conditions for forming gold-plated film 30X, a non-cyanic Au plating solution having a plating temperature of 50° C. is used, and the rate of deposition is set to 0.5 µm/min; thus, gold-plated film 30X having a height (thickness) of 8 µm is formed. The crystal structure of gold-plated film 30X immediately after formation is an aggregate of fine crystal grains overall.

Figure 5C:
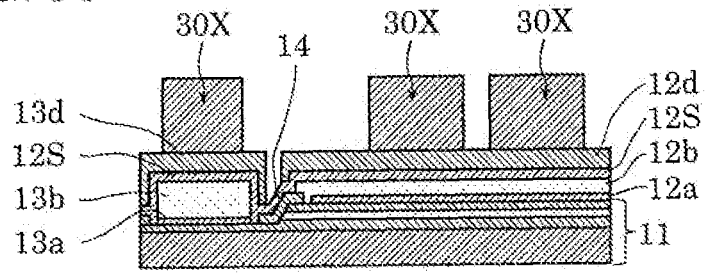
FIG. 5C is a diagram illustrating the process of removing a resist in a third step in a method for manufacturing a semiconductor device according to Embodiment 1.

Next, as illustrated in FIG. 5C, resist 16 is removed. For example, resist 16 is removed using an organic solvent or the like. Thus, the plurality of gold-plated films 30X each in the shape of a rectangular prism are formed in predetermined regions on cover electrode 12d of first p-side electrode 12 and cover electrode 13d of first n-side electrode 13.

In this case, the distance between adjacent gold-plated films 30X is the distance between adjacent metal bumps 30Y and is set to such a level that adjacent metal bumps 30Y contact each other when semiconductor element 10 is mounted on mounting substrate 20. For example, in the case of forming a plurality of gold-plated films 30X each in the shape of a rectangular prism having a height of 8 µm and an upper rectangular surface with a side length of 25 µm, the distance between adjacent gold-plated films 30 is, for example, 6 µm.

Figure 5D:
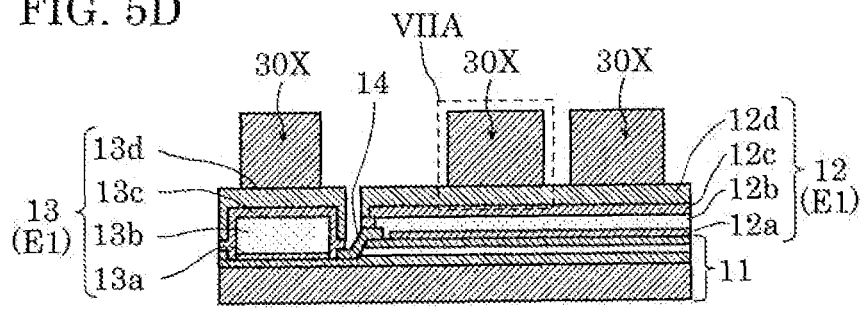
FIG. 5D is a diagram illustrating the process of pn isolation of an electrode by removing a portion of a seed film in a third step in a method for manufacturing a semiconductor device according to Embodiment 1.

Next, as illustrated in FIG. 5D, a portion of seed film 12S on oxide film 14 located between barrier electrode 12b of first p-side electrode 12 and barrier electrode 13b of first n-side electrode 13 is removed. In the present embodiment, since seed film 12S has a laminated structure of the Au layer and the Ti layer, first, the upper layer, i.e., the Au layer, of seed film 12S is removed using an iodine solution, and then the lower layer, i.e., the Ti layer, of seed film 12S is removed using dilute hydrofluoric acid, resulting in exposure of oxide film 14. This enables pn isolation of first electrode E1 by splitting seed film 12S as p-side seed layer 12c and n-side seed layer 13c on oxide film 14. Specifically, first electrode E1 divided as first p-side electrode 12, which has a laminated structure of reflective electrode 12a, barrier electrode 12b, seed layer 12c, and cover electrode 12d, and first n-side electrode 13, which has a laminated structure of ohmic contact layer 13a, barrier electrode 13b, seed layer 13c, and cover electrode 13d, can be formed.

Figure 5E:
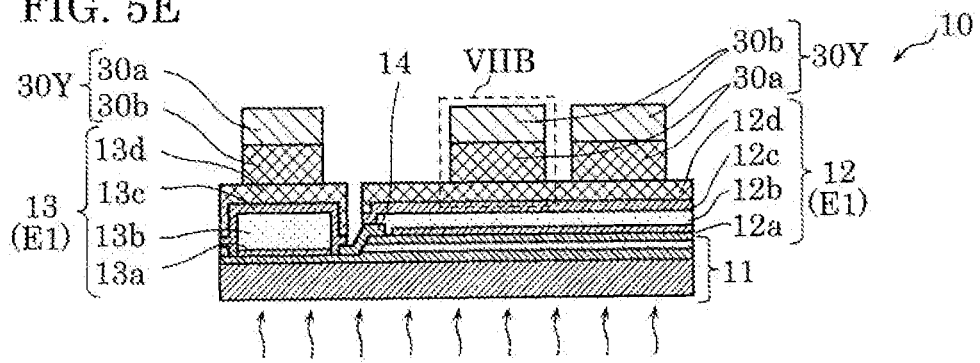
FIG. 5E is a diagram illustrating the process of performing heat treatment in a third step in a method for manufacturing a semiconductor device according to Embodiment 1.

Next, as illustrated in FIG. 5E, one-hour heat treatment is performed in an air atmosphere at 150° C. on the wafer having gold-plated film 30X formed thereon. This heat treatment changes the crystal grain size of each of a lower region of gold-plated film 30X and cover electrodes 12d, 13d. Accordingly, metal bump 30Y including two layers, namely, first layer 30a and second layer 30b, with the same composition, but different crystal grain sizes can be obtained. In metal bump 30Y, first layer 30a, which is close to semiconductor multilayer structure 11, has a larger crystal grain size than the crystal grain size of second layer 30b, which is far from semiconductor multilayer structure 11. The crystal grain size of crystals included in first layer 30a of metal bump 30Y is equal to the crystal grain size of crystals included in cover electrodes 12d, 13d.

Thus, semiconductor element 10 including first electrode E1 having the plurality of metal bumps 30Y formed thereon can be obtained. Specifically, semiconductor element 10 including first p-side electrode 12 having the plurality of metal bumps 30Y formed thereon and first n-side electrode 13 having metal bump 30Y formed thereon can be obtained.

Note that in the present embodiment, the plurality of metal bumps 30Y are arranged in a matrix. The distance between the plurality of metal bumps 30Y is set to such a level that adjacent metal bumps 30Y contact each other by the process of mounting semiconductor element 10 on mounting substrate 20.

Figure 7A:
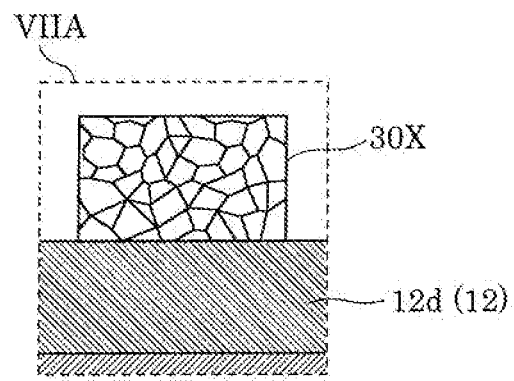
FIG. 7A is an enlarged view of region VITA in FIG. 5D.
Figure 7B:
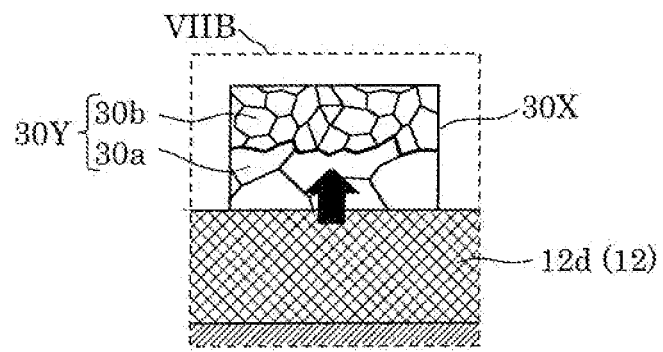
FIG. 7B is an enlarged view of region VIIB in FIG. 5E.
Figure 7C:
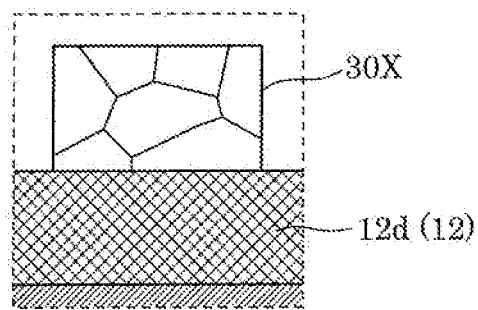
FIG. 7C illustrates crystal grains resulting from further coarsening of crystal grains in FIG. 7B.

Here, changes in the crystal grain size by the heat treatment in FIG. 5E will be described in detail with reference to FIG. 7A to FIG. 7C. FIG. 7A is an enlarged view of region VIIA in FIG. 5D. FIG. 7B is an enlarged view of region VIIB in FIG. 5E. FIG. 7C illustrates crystal grains resulting from further coarsening of crystal grains in FIG. 7B. FIG. 7A to FIG. 7C each illustrate a region corresponding to single gold-plated film 30X or metal bump 30Y on first p-side electrode 12 of first electrode E1 and a portion of cover electrode 12d of first p-side electrode 12 that is located below said single gold-plated film 30X or metal bump 30Y.

FIG. 7A illustrates a cross section of gold-plated film 30X immediately after formation of gold-plated film 30X. As illustrated in FIG. 7A, gold-plated film 30X immediately after formation is an aggregate of fine crystal grains overall.

After the heat treatment using a hot plate starts on the wafer having gold-plated film 30X formed thereon, heat efficiently transfers from the first p-side electrode 12 (cover electrode 12d) side to gold-plated film 30X in the direction of the arrow, as illustrated in FIG. 7B. The heat transferred to gold-plated film 30X serves as driving energy for recrystallizing gold included in gold-plated film 30X, and thus the crystal grains on the first p-side electrode 12 side grow significantly. As the heat treatment continues, the crystal grains are coarsened from the first p-side electrode 12 side toward the tip of gold-plated film 30X, and eventually coarsened crystal grains are spread all over gold-plated film 30X, as illustrated in FIG. 7C. The crystal grains are further coarsened with increasing heat treatment temperature or increasing heat treatment time.

The heat treatment conditions (one-hour heat treatment at 150° C.) for forming metal bump 30Y in the present embodiment are not conditions for coarsening gold-plated film 30X up to the tip thereof by recrystallization as illustrated in FIG. 7C, but are conditions for stopping the coarsening of the crystal grains along the way in gold-plated film 30X as illustrated in FIG. 7B. In other words, as a result of performing the one-hour heat treatment on gold-plated film 30X in the air atmosphere at 150° C., metal bump 30Y, which has substantially two-layer structure when classified by the crystal grain size, is formed. Specifically, metal bump 30Y including: first layer 30a located close to first p-side electrode 12 and having coarsened crystal grains; and second layer 30b located opposite to first p-side electrode 12 and having relatively small crystal grains is formed.

It is not only gold-plated film 30X formed on first p-side electrode 12 of first electrode E1 that have crystal grains changed; the crystal grains in gold-plated film 30X formed on first n-side electrode 13 of first electrode E1 also change as in gold-plated film 30X formed on first p-side electrode 12. Specifically, the one-hour heat treatment at 150° C. causes gold-plated film 30X formed on first n-side electrode 13 to change into two layers having different crystal grain sizes, resulting in formation of metal bump 30Y including: first layer 30a located close to first n-side electrode 13 and having coarsened crystal grains; and second layer 30b located opposite to first n-side electrode 13 and having relatively small crystal grains, as illustrated in FIG. 7B.

Thus, metal bump 30Y includes first layer 30a and second layer 30b having different metal crystal grain sizes. Specifically, in metal bump 30Y, the average crystal grain size of the crystals included in first layer 30a is larger than the average crystal grain size of the crystals included in second layer 30b.

Here, the relationship between the crystal grain size and the hardness of a metal will be described. Generally, there is a negative correlation between the crystal grain size and the hardness of a metal. In other words, the hardness increases as the crystal grain size is reduced. Conversely, the hardness is reduced as the crystal grain size increases. This is because the hardness of a metal depends on the amount of plastic deformation of the metal that occurs when a load is placed thereon, and the amount of plastic deformation is affected by obstacles against multiplication and migration of dislocation, slip plane length and metal crystal orientation.

The slip plane of metal crystals is fixed in a specific direction of a crystal lattice; when stress is exerted, slip occurs in that direction, causing plastic deformation of the metal. In other words, a metal crystalline body having a large crystal grain size has a long slip line and when stress is exerted, the stress is concentrated on crystal boundaries, and thus plastic deformation is likely to occur around the crystal boundaries. This means that the metal crystalline body having a large crystal grain size is soft.

In contrast, an individual grain of a metal crystalline body having a small crystal grain size has a short slip plane and when stress is exerted, there are many slip planes that do not match the direction of the stress. Therefore, such crystals serve as resistance to reduce slip, lowering the likelihood of the plastic deformation of the metal. This means that the metal crystalline body having a small crystal grain size is hard.

The above relationship between the crystal grain size and the hardness is also true for a gold-plated film. Specifically, there is a negative correlation between the crystal grain size and the hardness of metal bump 30Y including gold-plated film 30X. In other words, as the average crystal grain size of the crystals included in gold-plated film 30X increases, the hardness is reduced.

Furthermore, in metal bump 30Y according to the present embodiment, first layer 30a has crystal grains coarsened due to recrystallization with heat as a result of the heat treatment of gold-plated film 30X. Specifically, in metal bump 30Y, first layer 30a, which includes crystals having a relatively large average crystal grain size, is softer than second layer 30b, which includes crystals having a relatively small average crystal grain size.

Furthermore, a method for measuring the crystal grain sizes of gold-plated film 30X and metal bump 30Y used in the present embodiment will be described below. In the present embodiment, a cross section of gold-plated film 30X or metal bump 30Y is formed using a focused ion beam (FIB), then the intercept method is applied to an observation region observed in a scanning ion microscopy image (SIM image) from a scanning microscope, and thus the crystal grain size is measured.

Figure 8:
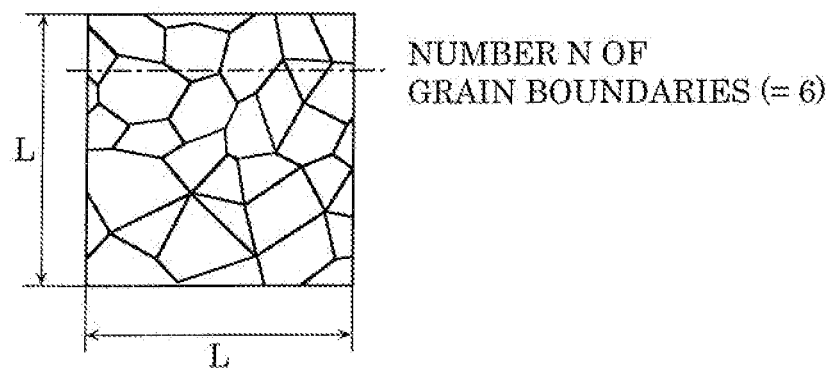
FIG. 8 illustrates a method for measuring a crystal grain size.

At this time, as illustrated in FIG. 8, when there are n crystals having average crystal grain size d per side of a square with each side of length L, the area of the square is $L^2$, and the area of one crystal grain size is $\Pi(d/2)^2$. Furthermore, when the observation region is relatively large for the crystal grains, since there are $n^2$ crystal grains in the square, the area occupied by all the crystal grains is $n^2 \times \Pi (d/2)^2$, resulting in the area of the square=the area occupied by all the crystal grains, which is $L^2 = n^2 \times \Pi(d/2)^2$. Using d, this is expressed as the following relational expression: $d = 2L/n/(\Pi)^{1/2}$. According to the relational expression, a straight line (the dashed-dotted line in FIG. 8) is drawn on observation region L×L, and assuming that the number of grain boundaries crossing the straight line is number n of crystals, average crystal grain sizes d of gold-plated film 30X and metal bump 30Y in the horizontal and height directions are determined.

In this case, the horizontal direction is parallel to the upper surfaces of cover electrodes 12d, 13d, and the height direction is perpendicular to the upper surfaces of cover electrodes 12d, 13d. Note that in FIG. 8, the dashed-dotted straight line crosses six grain boundaries, and thus n=6.

In the present embodiment, metal bump 30Y including first layer 30a and second layer 30b having different crystal grain sizes has the cross section illustrated in FIG. 7B. In this case, the crystal grain sizes of metal bump 30Y are measured by the above-described method; the average crystal grain size of first layer 30a in the horizontal direction is 8 μm, the average crystal grain size of second layer 30b in the horizontal direction is 1 μm, the average crystal grain size of first layer 30a in the height direction is 3 μm, and the average crystal grain size of second layer 30b in the height direction is 2 μm.

Figure 9:
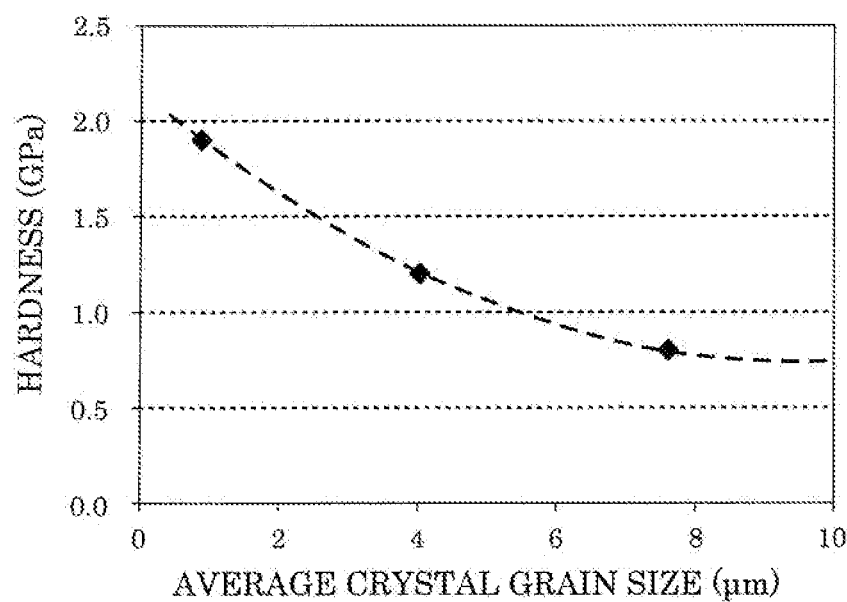
FIG. 9 illustrates the relationship between the average crystal grain size of a gold-plated film and the hardness of a single-layered gold-plated film.

An experiment was conducted to demonstrate the relationship between the average crystal grain size of a gold-plated film and the hardness of a single-layered gold-plated film; the result of this experiment will be described with reference to FIG. 9. FIG. 9 illustrates the relationship between the average crystal grain size of a gold-plated film and the hardness of a single-layered gold-plated film.

In this experiment, a gold-plated films having a thickness of 10 μm was prepared using a non-cyanic Au plating solution having a plating temperature of 50° C. by setting the rate of deposition to 0.5 μm/min. The average crystal grain size is controlled by changing the heat treatment conditions for the single-layered gold-plated film; the relationship between the average crystal grain size of the gold-plated film after the heat treatment and the hardness of the single-layered gold-plated film before the heat treatment was monitored. The average crystal grain size of the gold-plated film was measured using the above-described method for measuring a crystal grain size. In this case, the average crystal grain size in the horizontal direction was measured. Regarding the hardness of the single-layered gold-plated film, the hardness was measured through the Vickers hardness test. Note that in the following description, unless otherwise noted, the average crystal grain size represents the average crystal grain size in the horizontal direction.

As illustrated in FIG. 9, there is a negative correlation between the average crystal grain size of the gold-plated film and the hardness of the single-layered gold-plated film. In other words, the hardness increases as the average crystal grain size of the crystals included in the gold-plated film is reduced. Conversely, the hardness is reduced as the average crystal grain size of the crystals included in the gold-plated film increases. Thus, the hardness of the gold-plated film is reduced with an increase in the average crystal grain size of the gold-plated film, and increases with a decrease in the average crystal grain size of the gold-plated film.

For example, as illustrated in FIG. 9, when the average crystal grain size of the crystals included in the gold-plated film is 8 μm, the hardness of the gold-plated film is approximately 0.8 GPa. Specifically, in metal bump 30Y formed under the above-described heat treatment conditions, first layer 30a having an average crystal grain size of 8 μm is approximately 0.8 GPa.

When the average crystal grain size of the crystals included in the gold-plated film is 1 μm, the hardness of the gold-plated film is approximately 1.9 GPa. Specifically, in metal bump 30Y formed under the above-described heat treatment conditions, second layer 30b having an average crystal grain size of 1 μm is approximately 1.9 GPa.

Thus, the average crystal grain sizes are compared, and a film having a larger crystal grain size becomes a soft layer while a film having a smaller crystal grain size becomes a hard layer. Specifically, a gold-plated film having an average crystal grain size of 8 μm (first layer 30a) is softer than a gold-plated film having an average crystal grain size of 1 μm (second layer 30b).

[Fourth Step (Step for Mounting Semiconductor Element on Mounting Substrate)]

Figure 6A:
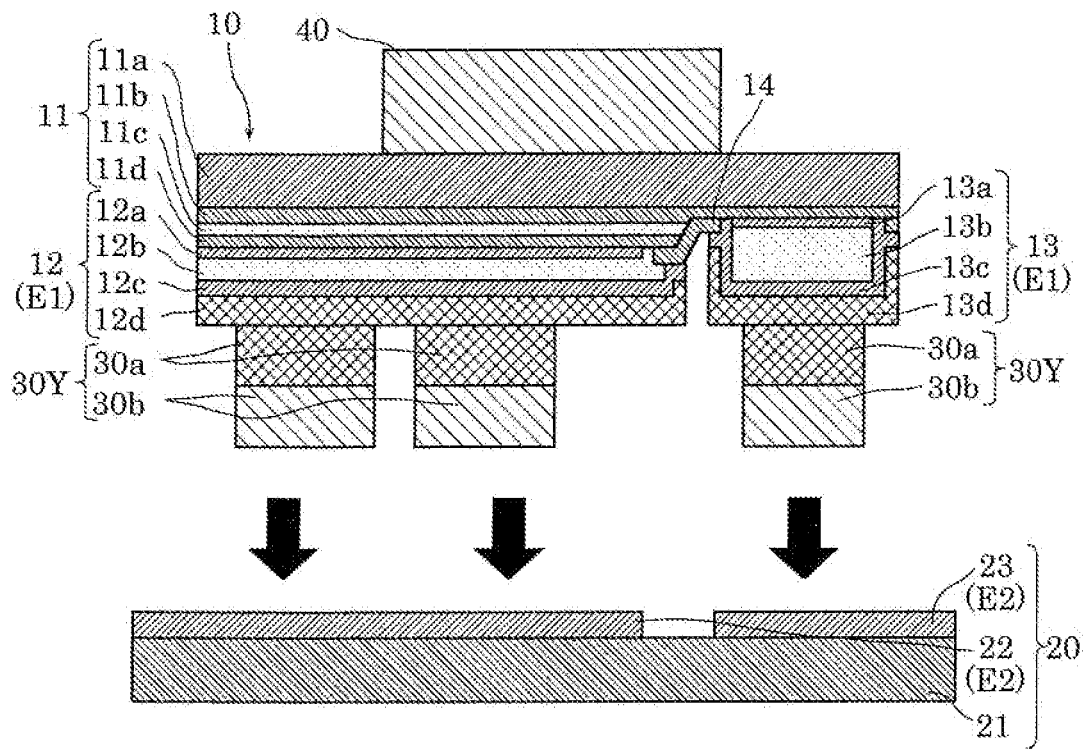
FIG. 6A is a diagram illustrating the process of placing a semiconductor element on a mounting substrate in a fourth step in a method for manufacturing a semiconductor device according to Embodiment 1.
Figure 6B:
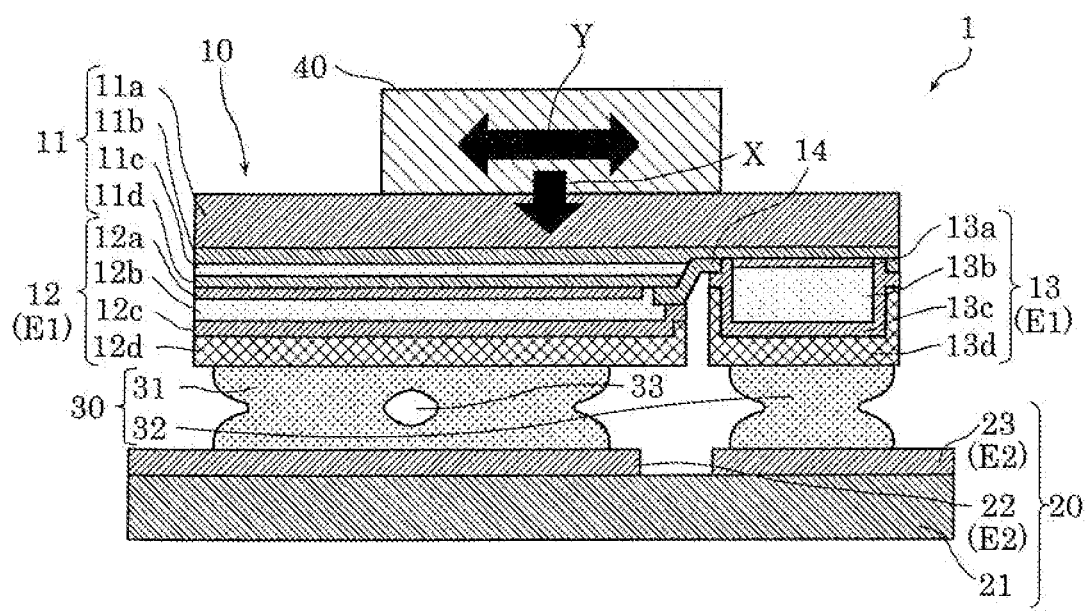
FIG. 6B is a diagram illustrating the process of mounting a semiconductor element on a mounting substrate and ultrasonically bonding the semiconductor element and the mounting substrate together in a fourth step in a method for manufacturing a semiconductor device according to Embodiment 1.

Next, semiconductor element 10 is mounted on mounting substrate 20 via metal bumps 30Y by flip-chip bonding according to the flow illustrated in FIG. 6A and FIG. 6B. FIG. 6A and FIG. 6B are diagrams illustrating the flow for mounting semiconductor element 10 on mounting substrate 20 via metal bumps 30Y by flip-chip bonding.

First, mounting substrate 20 on which semiconductor element 10 is to be mounted is prepared. Specifically, substrate 21 having second p-side electrode 22 and second n-side electrode 23 formed thereon as second electrode E2 is prepared as mounting substrate 20. In the present embodiment, substrate 21 is a ceramic substrate made from a sintered body of AlN. Second p-side electrode 22 and second n-side electrode 23, which are gold-plated films, were formed using a non-cyanic Au plating solution. Although not illustrated in the drawings, a seed layer divided by second p-side electrode 22 and second n-side electrode 23 may be formed between substrate 21 and second p-side and n-side electrodes 22, 23.

Subsequently, as illustrated in FIG. 6A, semiconductor element 10 having metal bumps 30Y formed thereon in advance is prepared, and holing metal tube 40 of a mounter picks up and carries semiconductor element 10 by vacuum suction in such a manner that the metal bump 30Y side faces mounting substrate 20. Note that in the present embodiment, 800 μm square and 100 μm thick semiconductor element 10 is used.

Next, as illustrated in FIG. 6B, metal bump 30Y of semiconductor element 10 and second electrode E2 (second p-side electrode 22 and second n-side electrode 23) of mounting substrate 20 are brought into contact with each other and heated to approximately 200° C. in this state, and ultrasonic vibration is applied to mounting substrate 20 in the horizontal direction (the direction of arrow Y in the figure; the second direction) for 200 milliseconds while a 30N load is placed on mounting substrate 20 in the vertical direction (the direction of arrow X in the figure; the first direction) using holding metal tube 40; thus, metal bump 30Y and second electrode E2 (second p-side electrode 22 and second n-side electrode 23) of mounting substrate 20 are ultrasonically bonded together.

A change occurring in metal bump 30Y when ultrasonically bonding metal bump 30Y and the second electrode of mounting substrate 20 together will be described in detail with reference to FIG. 10 and FIG. 11A to FIG. 11E.

Figure 10:
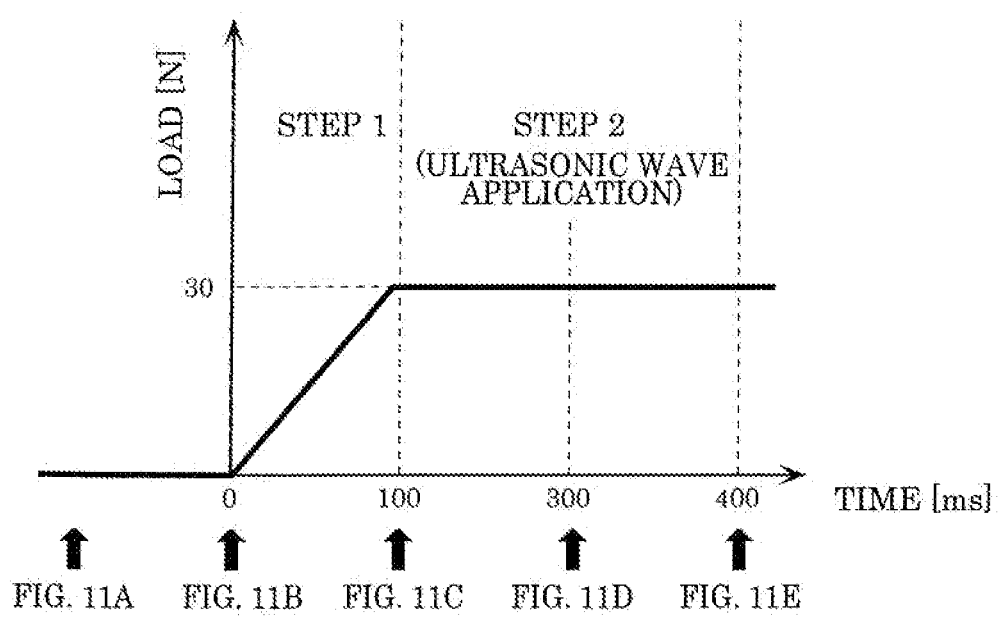
FIG. 10 is a timing chart for a bonding process according to Embodiment 1 when mounting a semiconductor element on a mounting substrate.

FIG. 10 is a timing chart for a bonding process according to Embodiment 1 when mounting semiconductor element 10 on mounting substrate 20. In FIG. 10, the horizontal axis represents time, and the vertical axis represents a load. Note that in the horizontal axis, time on the negative side of 0 milliseconds represents a point in time before the start of the processing, and 0 milliseconds represents the point in time of the start of the processing.

As illustrated in FIG. 10, the load gradually increases in the period of 100 milliseconds (STEP 1) after the start of the bonding process for semiconductor element 10 and mounting substrate 20. In STEP 1, no ultrasonic waves are applied, but only the load is placed. In the period between 100 milliseconds and 400 milliseconds (STEP 2), ultrasonic waves are applied while the load is maintained at a constant level. Semiconductor element 10 and mounting substrate 20 are ultrasonically bonded via metal bump 30Y through such a bonding process illustrated in the timing chart.

In this case, FIG. 11A to FIG. 11E illustrate cross sections of portions of semiconductor element 10 and mounting substrate 20 that are bonded together, specifically, portions of two adjacent metal bump 30Y and the second electrode of mounting substrate 20 that are bonded together, at a point in time before the start of the bonding process for semiconductor element 10 and mounting substrate 20 and 0 milliseconds, 100 milliseconds, 300 milliseconds, and 400 milliseconds after the start of the bonding process. Although FIG. 11A to FIG. 11E illustrate only the bonded portions on second p-side electrode 22 of second electrode E2 of mounting substrate 20, the same is true for the bonded portions on second n-side electrode 23 of second electrode E2.

Figure 11A:
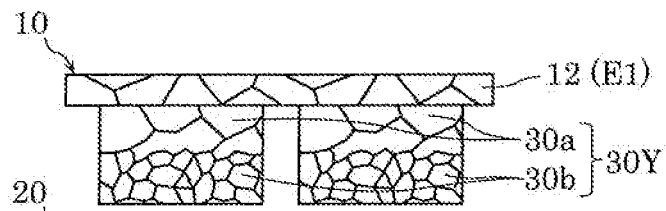
FIG. 11A is a cross-sectional view schematically illustrating metal bumps and a second electrode of a mounting substrate before a bonding process for a semiconductor element and the mounting substrate.

FIG. 11A illustrates metal bumps 30Y and second electrode E2 of mounting substrate 20 before the bonding process for semiconductor element 10 and mounting substrate 20. As illustrated in FIG. 11A, the crystal grains of gold (Au) included in first layer 30a and second layer 30b of each metal bump 30Y have approximately the same grain size in each layer. Note that metal bumps 30Y have the same shape, specifically, the shape of a rectangular prism.

Figure 11B:
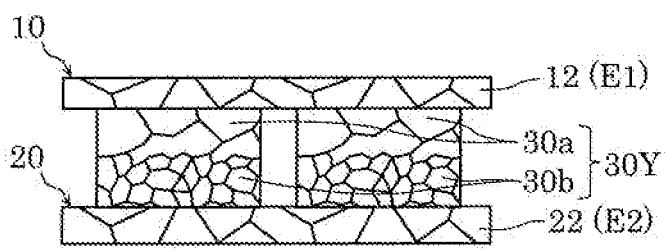
FIG. 11B is a cross-sectional view schematically illustrating metal bumps and a second electrode of a mounting substrate at the start of a bonding process for a semiconductor element and the mounting substrate.

FIG. 11B illustrates metal bumps 30Y and second electrode E2 of mounting substrate 20 at the start (0 milliseconds) of the bonding process for semiconductor element 10 and mounting substrate 20. Specifically, FIG. 11B illustrates the state where the tip surface of metal bump 30Y formed on semiconductor element 10 is brought into contact with second electrode E2 of mounting substrate 20. As illustrated in FIG. 11B, at the start of the process (0 milliseconds), first layer 30a and second layer 30b of each metal bump 30Y have approximately the same grain size as in FIG. 11A.

Subsequently, after the plurality of metal bumps 30Y formed on semiconductor element 10 are brought into contact with second electrode E2 of mounting substrate 20, the process in STEP 1 in FIG. 10 is performed. Specifically, in STEP 1, a load (mounting load) is placed on semiconductor element 10 and mounting substrate 20, between which the plurality of metal bumps 30Y are sandwiched, in a direction perpendicular to the principal surface of mounting substrate 20.

Figure 11C:
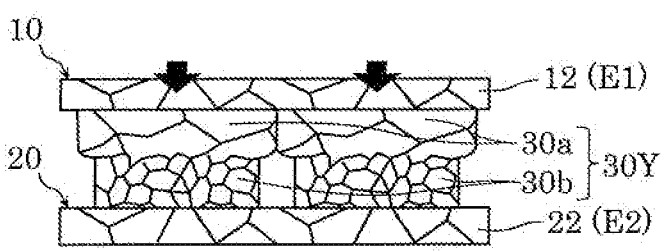
FIG. 11C is a cross-sectional view schematically illustrating metal bumps and a second electrode of a mounting substrate that are bonded together at the transition from STEP 1 to STEP 2 in FIG. 10 (approximately 100 milliseconds later after the start of the process)

As illustrated in FIG. 10, the load gradually increases in STEP 1. Accordingly, as the load is placed, entire first layer 30a, which is relatively softer than second layer 30b, is deformed and spread horizontally. At this time, second layer 30b, which is relatively harder than first layer 30a, is not deformed, but maintains approximately the same shape as that before the start of the process. As a result, the shape of each metal bump 30Y becomes an approximate wide top shape with horizontally spreading first layer 30a, as illustrated in FIG. 11C. Note that the second electrode (second p-side electrode 22 and second n-side electrode 23) of mounting substrate 20 maintains the same surface shape as that before the start of the process.

As a result of entire first layer 30a of each metal bump 30Y being deformed and spread horizontally, adjacent metal bumps 30Y are brought into contact with each other, as illustrated in FIG. 11C. Specifically, first layers 30a of adjacent metal bumps 30Y come into contact with each other. Note that second layers 30b of adjacent metal humps 30Y are not in contact with each other.

FIG. 11C illustrates metal bumps 30Y and second electrode E2 of mounting substrate 20 that are bonded together at the transition from STEP 1 to STEP 2 in FIG. 10 (approximately 100 milliseconds later after the start of the process). Although the load increases from load 0 N to load 30 N in the form of a linear function in a 100-millisecond period in STEP 1 in the present embodiment, this is not limiting.

Figure 11D:
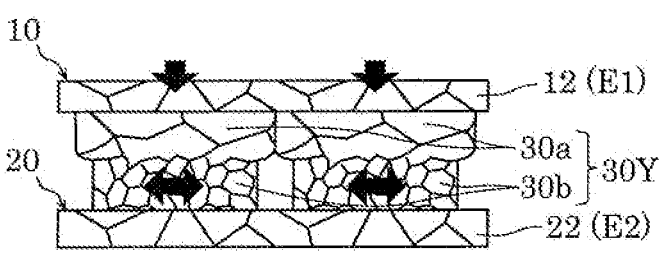
FIG. 11D is a cross-sectional view schematically illustrating metal bumps and a second electrode of a mounting substrate that are bonded together in the middle of STEP 2 in FIG. 10 (approximately 300 milliseconds later after the start of the process and approximately 200 milliseconds later after the start of ultrasonic vibration)

Subsequently, after adjacent metal bumps 30Y come into contact with each other, the transition occurs from STEP 1 to STEP 2, as illustrated in FIG. 10. In STEP 2, as illustrated in FIG. 11D, a predetermined load is placed on semiconductor element 10 and mounting substrate 20, between which metal bumps 30Y are sandwiched, in a direction perpendicular to the principal surface of mounting substrate 20 (the direction of arrow X in the figure), and ultrasonic waves are applied in a direction horizontal to the principal surface of mounting substrate 20 (the direction of arrow Y in the figure). In the present embodiment, ultrasonic vibration is applied in the state where the same load as the last load in STEP 1 is placed on semiconductor element 10 and mounting substrate 20 between which the plurality of metal bumps 30Y are sandwiched.

Note that FIG. 11D illustrates metal bumps 30Y and second electrode E2 of mounting substrate 20 that are bonded together in the middle of STEP 2 in FIG. 10 (approximately 300 milliseconds later after the start of the process and approximately 200 milliseconds later after the start of the ultrasonic vibration).

As a result of such ultrasonic wave application while placing the load, metal bump 30Y vibrates in the direction horizontal to mounting substrate 20, and the interface at which second layer 30b of metal bump 30Y and second electrode E2 of mounting substrate 20 are in contact is heated by friction, leading to solid-phase bonding and integration of metal bump 30Y and second electrode E2 of mounting substrate 20. Specifically, the ultrasonic vibration with the load being placed causes metal bump 30Y to rub against second electrode E2, and thus a portion at the interface between metal bump 30Y and second electrode E2 is recrystallized. At this time, there are cases where some of the Au crystal grains in a surface layer of second electrode E2 and the Au crystal grains in second layer 30b of metal bump 30Y may be integrated without maintaining their original shapes and the boundary between second layer 30b of metal bump 30Y and second electrode E2 may become unclear.

Figure 11E:
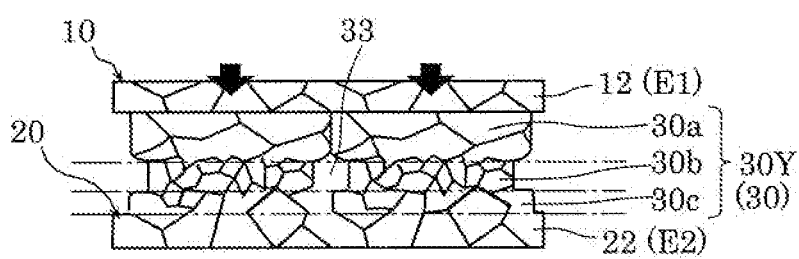
FIG. 11E is a cross-sectional view schematically illustrating metal bumps and a second electrode of a mounting substrate that are bonded together at the end of STEP 2 in FIG. 10 (approximately 400 milliseconds later after the start of the process and approximately 300 milliseconds later after the start of ultrasonic vibration)

Subsequently, as the load and ultrasonic wave application continues, the recrystallized portion at the interface between each metal bump 30Y and second electrode E2 becomes softer. Therefore, when semiconductor element 10 is pushed down with the load, a portion of second layer 30b of each metal bump 30Y at the interface between second layer 30b and second electrode E2 is deformed and spread horizontally. As a result, each metal bump 30Y is approximately in the shape of an hourglass with entire first layer 30a spreading horizontally and a portion of second layer 30b that is bonded to second electrode E2 spreading horizontally, as illustrated in FIG. 11E. In other words, each metal bump 30Y has a constricted shape with a center portion narrowing along the entire perimeter.

Furthermore, as a result of the recrystallized portion at the interface between second layer 30b of metal bump 30Y and second electrode E2 being deformed and spread horizontally, adjacent metal bumps 30Y come into contact with each other not only in first layers 30a, but also partially in second layers 30b, as illustrated in FIG. 11E. Specifically, aside from entire first layers 30a of adjacent metal bumps 30Y, portions of second layers 30b of adjacent metal humps 30Y that are bonded to second electrode E2 come into contact with each other.

FIG. 11E illustrates metal bumps 30Y and second electrode E2 of mounting substrate 20 that are bonded together at the end of STEP 2 in FIG. 10 (approximately 400 milliseconds later after the start of the process and approximately 300 milliseconds later after the start of the ultrasonic vibration).

In this manner, as the load and ultrasonic wave application continues, Au crystal grains originated from second layer 30b and Au crystal grains originated from second electrode E2 are integrated at the bonding interface between second layer 30b of metal bump 30Y and second electrode E2 of mounting substrate 20. Furthermore, as illustrated in FIG. 11E, third layer 30c is formed in a portion of second layer 30b of metal bump 30Y as a layer including coarsened Au crystal grains resulting from integration of the Au crystal grains from second layer 30b and the Au crystal grains from second electrode E2.

As a result, metal bump 30Y in which first layer 30a and third layer 30c have greater widths (diameters) than second layer 30b is formed, first layers 30a of adjacent metal bumps 30Y are connected to each other, and third layers 30c of adjacent metal bumps 30Y are connected to each other. Thus, the plurality of metal bumps 30Y formed between semiconductor element 10 and mounting substrate 20 are coupled to each other, not at center portions, but at upper and lower portions only, resulting in bonding metal layer 30 having hollow gap 33.

In the above-described manner, semiconductor device 1 in which first electrode E1 of semiconductor element 10 and second electrode E2 of mounting substrate 20 are bonded together by bonding metal layer 30, as illustrated in FIG. 6B, can be manufactured. Thus, bonding metal layer 30 in semiconductor device 1 is a metal layer obtained by deforming and integrating the plurality of metal bumps 30Y. Specifically, bonding metal layer 30 is formed by connecting first layers 30a of metal bumps 30Y to each other and connecting third layers 30c of metal bumps 30Y to each other, as illustrated in FIG. 11E. Gap 33 inside bonding metal layer 30 is a hollow region formed as a result of second layers 30b of metal bumps 30Y failing to be connected to each other.

[Working Effects, etc.]

Figure 12:
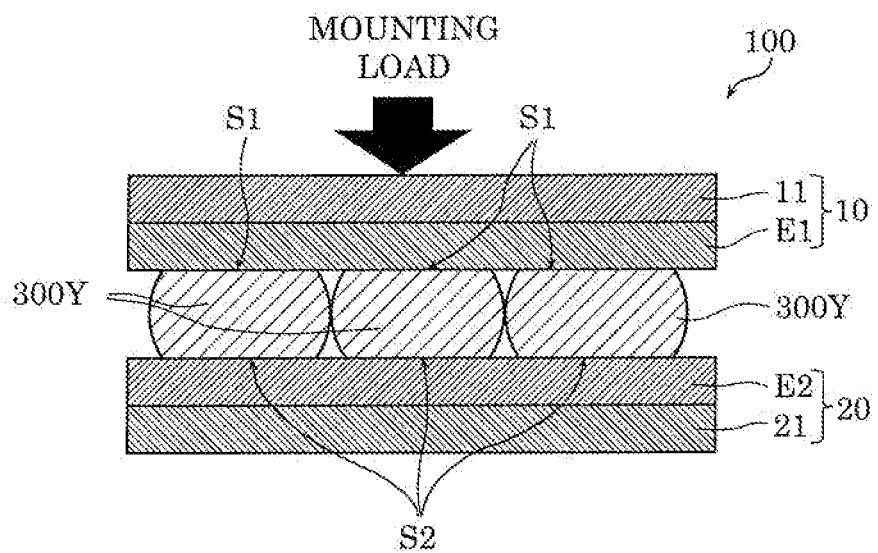
FIG. 12 is a cross-sectional view illustrating a method for manufacturing a conventional semiconductor device disclosed in Japanese Unexamined Patent Application Publication No. 2011-009429.
Figure 13:
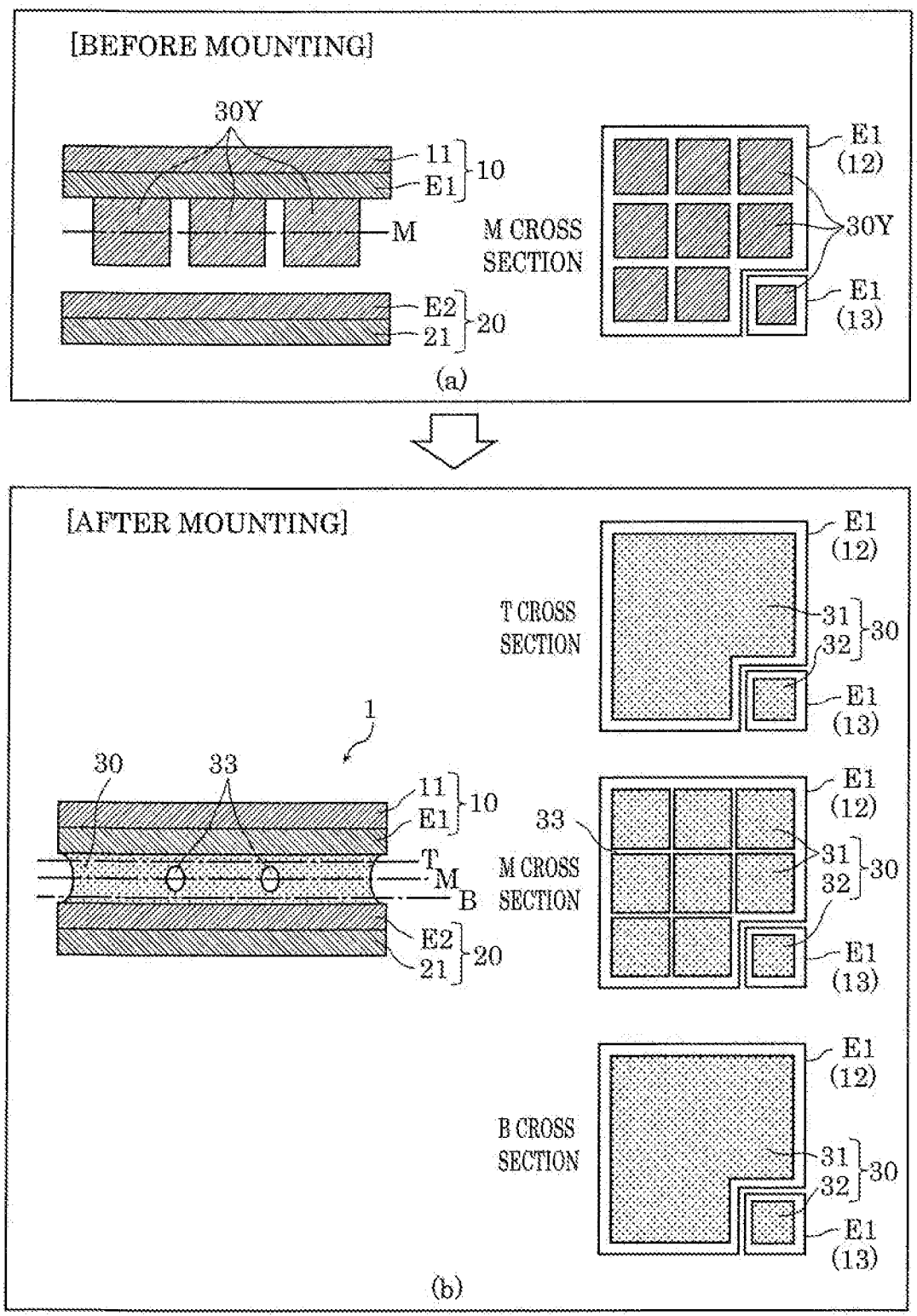
FIG. 13 is a diagram illustrating the configurations of a semiconductor device according to Embodiment 1 before and after mounting.

Next, working effects of semiconductor device 1 according to the present embodiment will be described in comparison to conventional semiconductor device 100. FIG. 12 is a cross-sectional view illustrating a method for manufacturing conventional semiconductor device 100 disclosed in Japanese Unexamined Patent Application Publication No. 2011-009429. FIG. 13 is a diagram illustrating the configurations of semiconductor device 1 according to Embodiment 1 before and after mounting. In FIG. 13, (a) is a cross-sectional view in which semiconductor element 10 has not yet been mounted on mounting substrate 20, and (b) is a cross-sectional view in which semiconductor element 10 has already been mounted on mounting substrate 20.

As illustrated in FIG. 12, conventional semiconductor device 100 is manufactured by bonding, via the plurality of metal bumps 300Y, semiconductor element 10 including semiconductor multilayer structure 11 and first electrode E1 and mounting substrate 20 including substrate 21 and second electrode E2. Specifically, semiconductor element 10 having the plurality of metal bumps 300Y formed thereon is mounted on mounting substrate 20.

At this time, upon deforming of metal bumps 300Y with load for mounting (mounting load), the mounting load is locally concentrated on contact surface S1 between first electrode E1 of semiconductor element 10 and metal bumps 300Y and the mounting substrate, and the mounting load is locally concentrated on contact surface S2 between second electrode E2 of mounting substrate 20 and metal bumps 300Y. This may result in damage to each of first electrode E1 of semiconductor element 10 and second electrode E2 of mounting substrate 20 due to metal bumps 300Y, causing a risk of electrode failures of first electrode E1 and second electrode E2.

In contrast, in semiconductor device 1 according to the present embodiment, at the time of mounting of semiconductor element 10 having the plurality of metal bumps 30Y formed thereon on mounting substrate 20, bonding metal layer 30 is formed so as to include gap 33 inside, as illustrated in FIG. 13.

Specifically, at the time of mounting semiconductor element 10 on mounting substrate 20 by placing the load, the plurality of metal bumps 30 are deformed in such a manner that upper portions of adjacent metal bumps 30Y come into contact with each other, lower portions of adjacent metal bumps 30Y come into contact with each other, and hollow gap 33 is left, as illustrated in FIG. 11A to FIG. 11E referred to above. This makes it possible to evenly distribute the load for mounting that is placed on each of the entire surface of first electrode E1 of semiconductor element 10 and the entire surface of second electrode E2 of mounting substrate 20. As a result, localized stress that metal bumps 30Y give to first electrode E1 and second electrode E2 at the time of mounting can be made small, and thus it is possible to reduce damage to first electrode E1 and second electrode E2 that may be caused by metal bumps 30Y.

Thus, with semiconductor device 1 according to the present embodiment, mounting damage due to electrode failures of first electrode E1 and second electrode E2 can be reduced; therefore, it is possible to provide semiconductor device 1 exceptionally reliable in the long run.

Furthermore, in semiconductor device 1 according to the present embodiment, gap 33 inside bonding metal layer 30 extends linearly along the outer side of first electrode E1 of semiconductor element 10.

Thus, when gap 33 of bonding metal layer 30 extends along the outer side of first electrode E1 of semiconductor element 10, it is considered that the plurality of metal bumps 30Y, which become bonding metal layer 30, have been arranged neatly in a matrix before mounting. In addition, when metal bumps 30Y are arranged neatly in a matrix, the load for mounting that is placed on the entire surface of each of first electrode E1 and second electrode E2 can be evenly distributed as compared to the case where metal bumps 30Y are arranged at random. Accordingly, localized stress that metal bumps 30Y give to first electrode E1 and second electrode E2 can be made small, and thus it is possible to reduce damage to first electrode E1 and second electrode E2 that may be caused by metal bumps 30Y.

Note that in the present description, regarding the wording "gap 33 extends along the outer side of first electrode E1", it is sufficient that gap 33 generally extend along the outer side of first electrode E1; for example, even if the outer side of first electrode E1 are not perfectly linear with small dents in a part of the outer side, linear gap 33 can be described as extending along the outer side of first electrode E1. In other words, as long as gap 33 extends along the outer side of first electrode E1 from a broad perspective, such a situation is included in the concept of gap 33 extending along the outer side of first electrode E1.

Furthermore, in semiconductor device 1 according to the present embodiment, gap 33 inside bonding metal layer 30 is parallel to the outer side of first electrode E1.

Thus, when gap 33 of bonding metal layer 30 is parallel to the outer side of first electrode E1, it is considered that metal bumps 30Y having the same width have been arranged neatly in a matrix before bonding. In addition, when metal bumps 30Y having the same width are arranged neatly in a matrix, the load for mounting that is placed on the entire surface of each of first electrode E1 and second electrode E2 can be evenly distributed as compared to the case where metal bumps 30Y having different widths are arranged. Accordingly, localized stress that metal bumps 30Y give to first electrode E1 and second electrode E2 can be made small, and thus it is possible to reduce damage to first electrode E1 and second electrode E2 that may be caused by metal bumps 30Y.

Furthermore, in semiconductor device 1 according to the present embodiment, height H of gap 33 inside bonding metal layer 30 is at least 10% of the height of bonding metal layer 30.

When the height of gap 33 is set to at least 10% of the height of bonding metal layer 30 as mentioned above, the size of gap 33 can be maintained to some extent. With this, the load for mounting can be effectively distributed, and thus it is possible to effectively reduce localized stress that metal bumps 30Y give to first electrode E1 and second electrode E2.

Here, other shapes of gap 33 of bonding metal layer 30 will be described with reference to FIG. 14A to FIG. 14O.

Figure 14A:
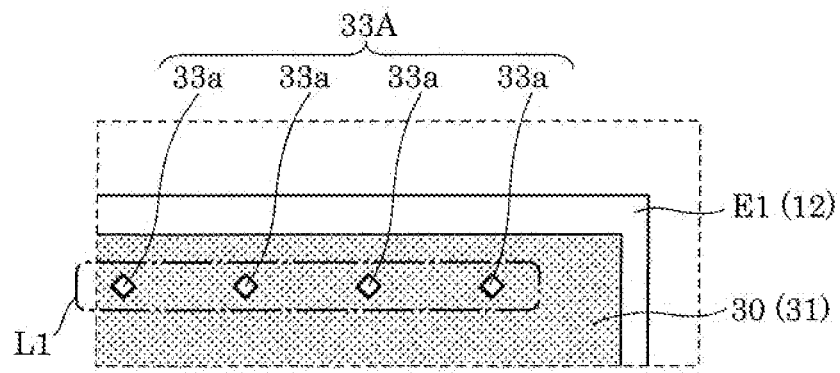
FIG. 14A is a diagram illustrating a gap pattern of a bonding metal layer in a semiconductor device according to Variation 1 of Embodiment 1.
Figure 14B:
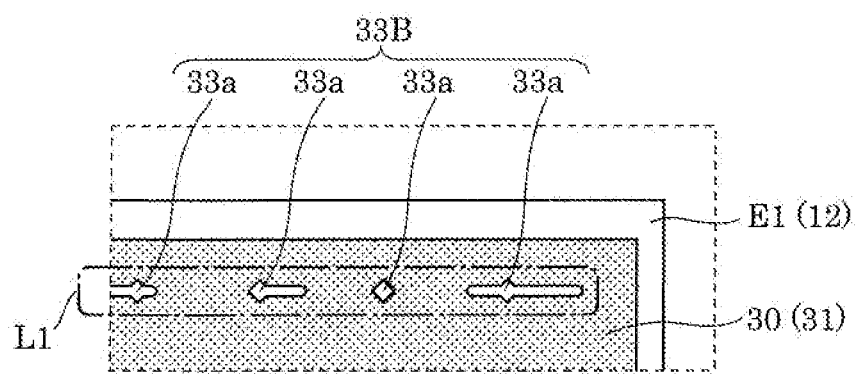
FIG. 14B is a diagram illustrating a gap pattern of a bonding metal layer in a semiconductor device according to Variation 2 of Embodiment 1.
Figure 14C:
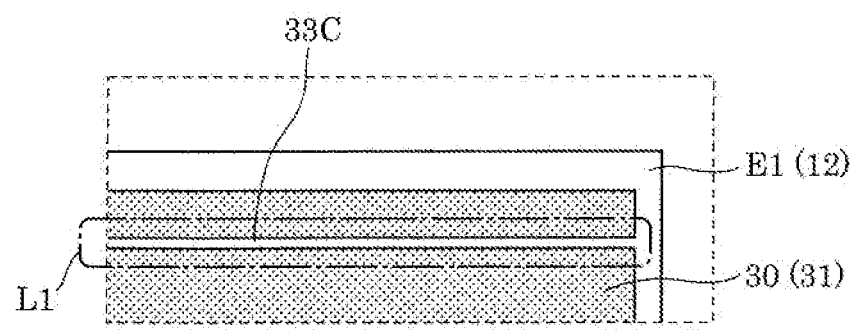
FIG. 14C is a diagram illustrating a gap pattern of a bonding metal layer in a semiconductor device according to Variation 3 of Embodiment 1.
Figure 14D:
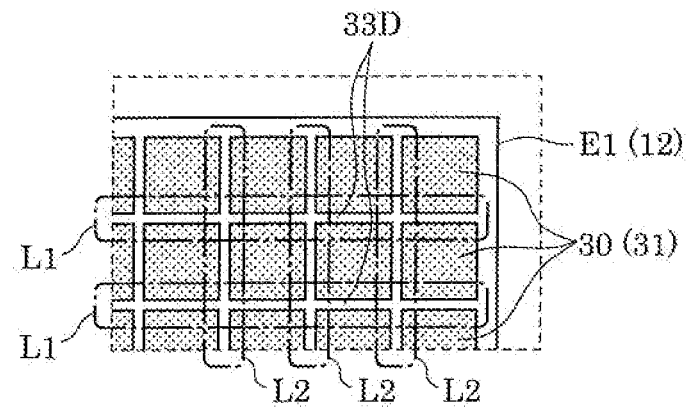
FIG. 14D is a diagram illustrating a gap pattern of a bonding metal layer in a semiconductor device according to Variation 4 of Embodiment 1.
Figure 14E:
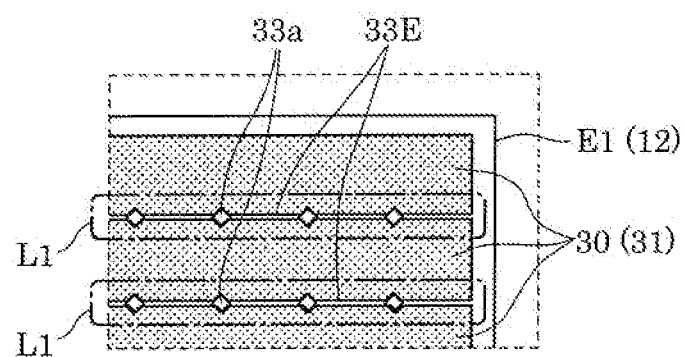
FIG. 14E is a diagram illustrating a gap pattern of a bonding metal layer in a semiconductor device according to Variation 5 of Embodiment 1.
Figure 14F:
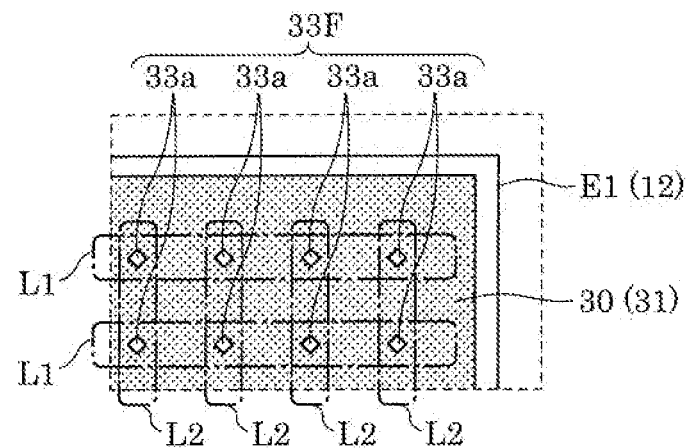
FIG. 14F is a diagram illustrating a gap pattern of a bonding metal layer in a semiconductor device according to Variation 6 of Embodiment 1.
Figure 14G:
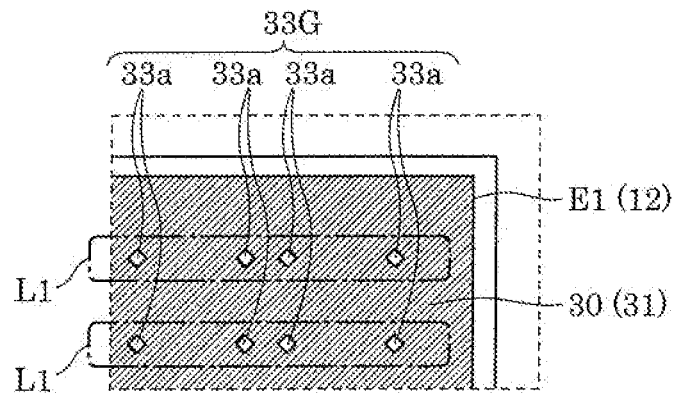
FIG. 14G is a diagram illustrating a gap pattern of a bonding metal layer in a semiconductor device according to Variation 7 of Embodiment 1.
Figure 14H:
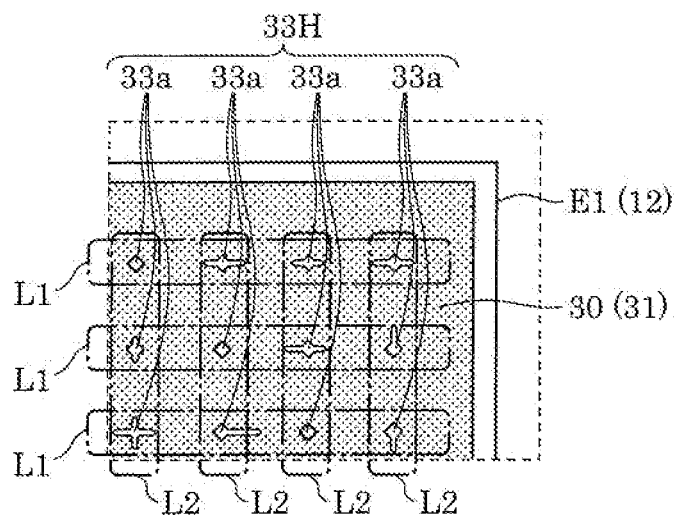
FIG. 14H is a diagram illustrating a gap pattern of a bonding metal layer in a semiconductor device according to Variation 8 of Embodiment 1.
Figure 14I:
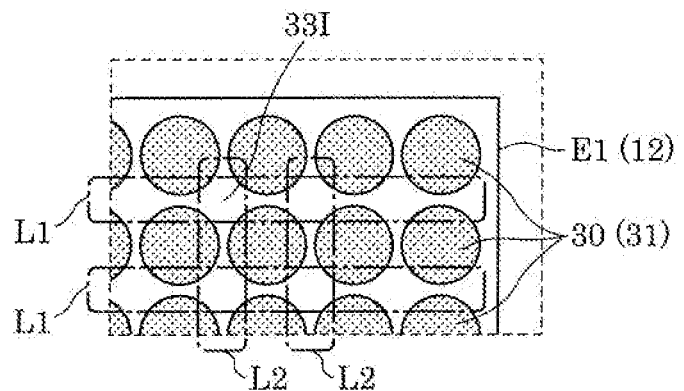
FIG. 14I is a diagram illustrating a gap pattern of a bonding metal layer in a semiconductor device according to Variation 9 of Embodiment 1.
Figure 14J:
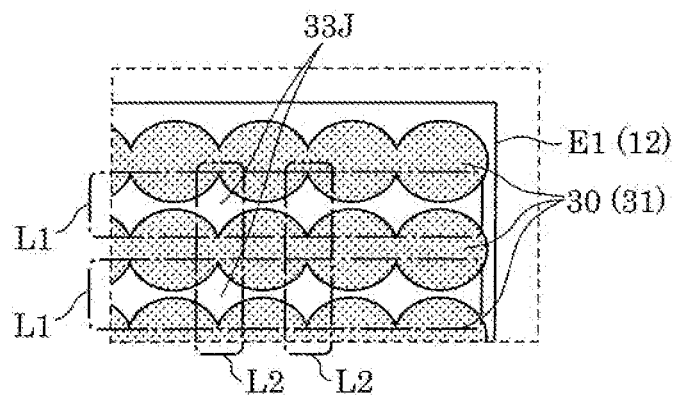
FIG. 14J is a diagram illustrating a gap pattern of a bonding metal layer in a semiconductor device according to Variation 10 of Embodiment 1.
Figure 14K:
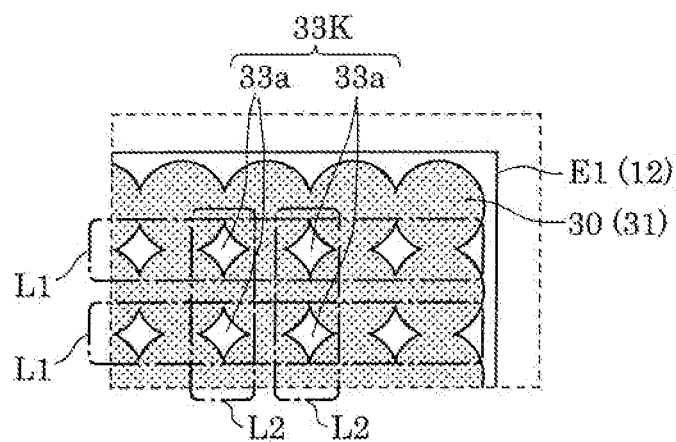
FIG. 14K is a diagram illustrating a gap pattern of a bonding metal layer in a semiconductor device according to Variation 11 of Embodiment 1.
Figure 14L:
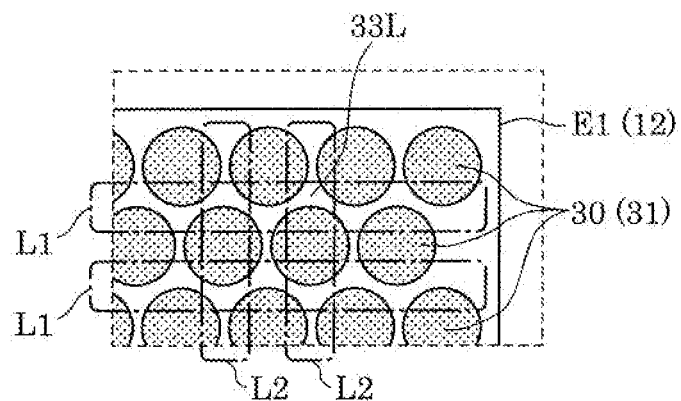
FIG. 14L is a diagram illustrating a gap pattern of a bonding metal layer in a semiconductor device according to Variation 12 of Embodiment 1.
Figure 14M:
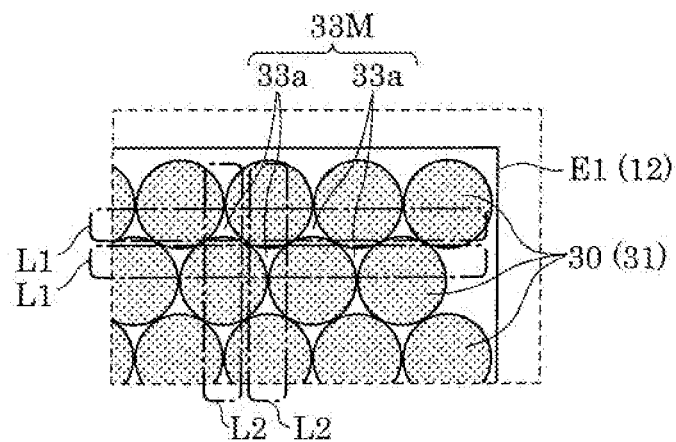
FIG. 14M is a diagram illustrating a gap pattern of a bonding metal layer in a semiconductor device according to Variation 13 of Embodiment 1.
Figure 14N:
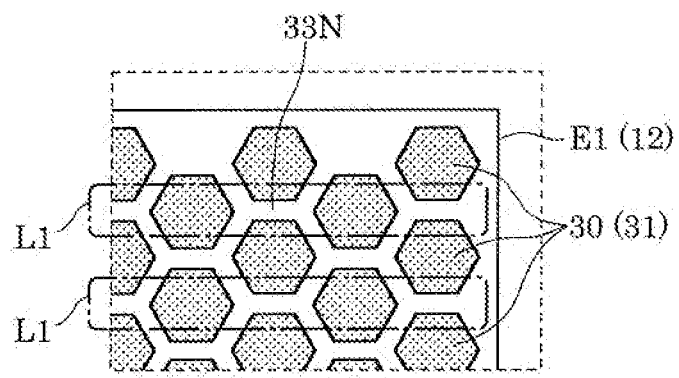
FIG. 14N is a diagram illustrating a gap pattern of a bonding metal layer in a semiconductor device according to Variation 14 of Embodiment 1.
Figure 14O:
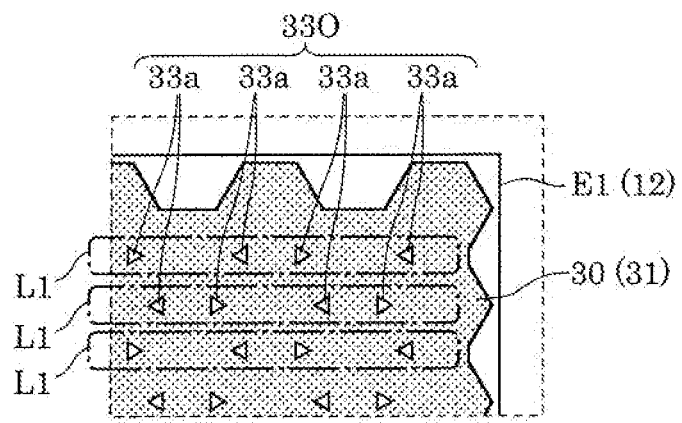
FIG. 14O is a diagram illustrating a gap pattern of a bonding metal layer in a semiconductor device according to Variation 15 of Embodiment 1.

FIG. 14A to FIG. 14O are cross-sectional views each illustrating a portion of a cross section in the M cross section in FIG. 13 [AFTER MOUNTING].

As illustrated in FIG. 2B, in Embodiment 1 described above, gap 33 inside bonding metal layer 30 is a continuous void, but this is not limiting.

For example, as illustrated in FIG. 14A, gap 33A inside bonding metal layer 30 may include a plurality of voids 33a in the form of dots (spots). Specifically, gap 33A may include first direction void L1 made up of a plurality of voids 33a arranged linearly along a first direction (for example, the row direction). In FIG. 14A, first direction void L1 is made up of the plurality of voids 33a arranged in a straight line. In this case, the plurality of voids 33a included in gap 33B may have different shapes, as illustrated in FIG. 14B. For example, the plurality of voids 33a are not required to be continuous; each of the plurality of voids 33a may be partially in the form of a line, a dot, or the like.

Note that in FIG. 14A and FIG. 14B, gaps 33A, 33B in first direction void L1 extend linearly along the outer side of first electrode E1. Specifically, gaps 33A, 33B are in the form of a dashed line and are parallel to one outer side of first electrode E1.

Alternatively, gap 33C inside bonding metal layer 30 may have first direction void L1 that is one continuous void, as illustrated in FIG. 14C. Note that also in FIG. 14C, gap 33C extends linearly along the outer side of first electrode E1. Specifically, gap 33C in first direction void L1 is in the form of a straight line and is parallel to one outer side of first electrode E1. Furthermore, an end of gap 33C may be exposed from the outer side of first electrode E1.

In Embodiment 1 described above, gap 33 inside bonding metal layer 30 is made up of voids in the form of two orthogonal straight lines, but this is not limiting. For example, gap 33D inside bonding metal layer 30 may be made up of two or more orthogonal straight lines, as illustrated in FIG. 14D. Specifically, gap 33D may include: first direction void L1 formed linearly along the first direction; and second direction void L2 formed linearly along a second direction (for example, the column direction) different from the first direction. In FIG. 14D, first direction void L1 is in the form of a straight line along the first direction, and second direction void L2 is in the form of a straight line along the second direction that is orthogonal to the first direction.

Also in FIG. 14D, gap 33D extends linearly along the outer side of first electrode E1. Specifically, gap 33D in first direction void L1 is in the form of a straight line and is parallel to one outer side of first electrode E1. Gap 33D in second direction void L2 is in the form of a straight line and is parallel to another outer side of first electrode E1.

Furthermore, in FIG. 14D, gap 33D includes a plurality of lines of gaps at a fixed interval. Specifically, gap 33D in first direction void L1 forms two or more lines at a fixed interval. Gap 33D in second direction void L2 forms two or more lines at a fixed interval.

Although the first direction in first direction void L1 and the second direction in second direction void L2 are orthogonal in FIG. 14D, this is not limiting as long as the first direction and the second direction intersect with each other. In this case, the plurality of voids in the form of straight lines included in first direction void L1 and the plurality of voids in the form of straight lines included in second direction void L2 are not required to be all in the same direction (in other words, in parallel), but some of the plurality of voids in the form of straight lines may extend in a different direction.

Furthermore, in FIG. 14D, gap 33D is made up of the plurality of voids formed along both the first and second directions, but this is not limiting. For example, gap 33E may be made up of a plurality of voids formed along only one of the first and second directions, as illustrated in FIG. 14E.

Furthermore, as in FIG. 14C, an end of gap 33D may be exposed from the outer side of first electrode E1. All the ends of gap 33D may be exposed from the outer side of first electrode E1, or some of the ends of gap 33D may be exposed from the outer side of first electrode E1.

In FIG. 14E, gap 33E includes only first direction void L1 made up of voids in the form of straight lines extending in the first direction. In this case, a portion of gap 33E may include a plurality of voids 33a having a width different from the width of a straight portion, as illustrated in FIG. 14E. In other words, the voids in the form of straight lines may include a portion having a different width.

Note that also in FIG. 14E, gap 33E extends linearly along the outer side of first electrode E1. Specifically, gap 33E in first direction void L1 is in the form of a straight line and is parallel to one outer side of first electrode E1. Furthermore, also in FIG. 14E, gap 33E includes a plurality of lines of gaps at a fixed interval. Specifically, gap 33E in first direction void L1 forms two or more lines at a fixed interval. Furthermore, as in FIG. 14D, an end of gap 33E may be exposed from the outer side of first electrode E1. All the ends of gap 33E may be exposed from the outer side of first electrode E1, or some of the ends of gap 33E may be exposed from the outer side of first electrode E1.

In FIG. 14D and FIG. 14E, gaps 33D, 33E are a combination of voids in the form of straight lines, but this is not limiting. For example, gap 33F may be made up of a plurality of voids 33a aligned in the form of dots, as illustrated in FIG. 14F. Specifically, gap 33F may include: first direction void L1 made up of a plurality of voids 33a arranged linearly along the first direction; and second direction void L2 made up of a plurality of voids 33a arranged linearly along the second direction that is orthogonal to the first direction. In FIG. 14F, each of first direction void L1 and second direction void L2 is made up of the plurality of voids 33a arranged in a straight line.

Note that also in FIG. 14F, gap 33F extends linearly along the outer side of first electrode E1. Specifically, gap 33F in first direction void L1 is in the form of a straight line and is parallel to one outer side of first electrode E1. Gap 33F in second direction void L2 is in the form of a straight line and is parallel to another outer side of first electrode E1. Furthermore, also in FIG. 14F, gap 33F includes a plurality of lines of gaps at a fixed interval. Specifically, gap 33F in first direction void L1 forms two or more lines at a fixed interval. Gap 33F in second direction void L2 forms two or more lines at a fixed interval.

As to gap 33F illustrated in FIG. 14F, the plurality of lines of first line voids L1 and the plurality of lines of second line voids L2 are each present at the fixed interval, but this is not limiting; only either the plurality of rows of first line voids L1 or the plurality of columns of second line voids L2 may be present at the fixed interval, as with gap 33G illustrated in FIG. 14G. Note that in the case of gap 33G illustrated in FIG. 14G, only the plurality of lines of first direction voids L1 are present at the fixed interval.

All the plurality of voids 33a included in gap 33F are in the form of dots as illustrated in FIG. 14F, but this is not limiting; the plurality of voids 33a included in gap 33H may have different shape, as illustrated in FIG. 14H. For example, the plurality of voids 33a are not required to be continuous; each of the plurality of voids 33a may be partially in the form of a line, a dot, or the like.

Bonding metal layer 30 according to Embodiment 1 described above is formed by deforming and integrating the plurality of metal bumps 30Y each in the shape of a rectangular prism, as illustrated in FIG. 2B, but this is not limiting.

For example, bonding metal layer 30 may be formed by deforming and integrating the plurality of metal bumps 30Y each in the shape of a circular column, as illustrated in FIG. 14I to FIG. 14M. Specifically, bonding metal layer 30 in FIG. 14I to FIG. 14K is formed by deforming and integrating the plurality of metal bumps 30Y each in the shape of a circular column and aligned in a grid pattern. As one example, metal bump 30Y in the shape of a circular column is formed of a gold-plated film in the shape of a circle having a diameter of 25 μm as seen from the top with a height of 8 μm.

In this case, gap 33I may be made up of voids in a grid pattern of two orthogonal straight lines, as illustrated in FIG. 14I. Note that also in FIG. 14I, gap 33I extends linearly along the outer side of first electrode E1. Specifically, gap 33I in first direction void L1 is in the form of a straight line and is parallel to one outer side of first electrode E1. Gap 33I in second direction void L2 is in the form of a straight line and is parallel to another outer side of first electrode E1.

Gap 33J may be made up of a plurality of voids, as illustrated in FIG. 14J. Note that also in FIG. 14J, gap 33J extends linearly along the outer side of first electrode E1. Specifically, gap 33I in first direction void L1 is in the form of a straight line and is parallel to one outer side of first electrode E1. Gap 33J in second direction void L2 is in the form of a plurality of dots and is parallel to another outer side of first electrode E1.

Gap 33K may be made up of voids 33a in the form of a plurality of dots aligned in a matrix, as illustrated in FIG. 14K. Note that also in FIG. 14K, gap 33K extends linearly along the outer side of first electrode E1. Specifically, in FIG. 14K, first direction gap L1 and second direction gap L2 are made up of the plurality of voids 33a arranged in the form of a dashed line. Gap 33K in first direction void L1 is parallel to one outer side of first electrode E1, and gap 33K in second direction void L2 is parallel to another outer side of first electrode E1.

Bonding metal layer 30 may be formed by deforming and integrating the plurality of metal bumps 30Y each in the shape of a circular column and aligned in a staggered pattern, as illustrated in FIG. 14L and FIG. 14M.

In this case, gap 33L may be made up of voids in a staggered grid pattern, as illustrated in FIG. 14L. Note that also in FIG. 14L, gap 33L extends linearly along the outer side of first electrode E1. Specifically, gap 33L in first direction void L1 is in the form of a straight line and is parallel to one outer side of first electrode E1. Gap 33L in second direction void L2 is in the form of a dashed line and is parallel to another outer side of first electrode E1.

Gap 33M may be made up of voids 33a in the form of a plurality of dots aligned in a matrix, as illustrated in FIG. 14M. Note that also in FIG. 14M, gap 33M extends linearly along the outer side of first electrode E1. Specifically, in FIG. 14M, first direction gap L1 and second direction gap L2 are made up of the plurality of voids 33a arranged in the form of a dashed line. Gap 33M in first direction void L1 is parallel to one outer side of first electrode E1, and gap 33M in second direction void L2 is parallel to another outer side of first electrode E1.

In FIG. 14I and FIG. 14M, bonding metal layer 30 is formed by deforming and integrating the plurality of metal bumps 30Y each in the shape of a circular column, but this is not limiting.

For example, bonding metal layer 30 may be formed by deforming and integrating the plurality of metal bumps 30Y each in the shape of a hexagonal column, as illustrated in FIG. 14N and FIG. 14O. Specifically, bonding metal layer 30 in FIG. 14N and FIG. 14O is formed by deforming and integrating the plurality of metal bumps 30Y each in the shape of a hexagonal column and aligned in a staggered pattern.

In this case, gap 33N may be made up of voids in a staggered grid pattern, as illustrated in FIG. 14N. Note that also in FIG. 14N, gap 33N extends linearly along the outer side of first electrode E1. Specifically, gap 33N in first direction void L1 is in the form of a dashed line and is parallel to one outer side of first electrode E1.

Gap 33O may be made up of voids 33a in the form of a plurality of dots, as illustrated in FIG. 14O. Note that also in FIG. 14O, gap 33O extends linearly along the outer side of first electrode E1. Specifically, first direction gap L1 is made up of the plurality of voids 33a arranged in the form of a dashed line. Gap 33O in first direction void L1 is parallel to one outer side of first electrode E1.

Note that also in FIG. 14I to FIG. 14O, gap 33I to gap 33O include a plurality of lines of gaps at a fixed interval. Specifically, gap 33I to gap 33O in at least one of first direction void L1 and second direction void L2 form two or more lines at a fixed interval.

Thus, when gap 33D to gap 33O are parallel to the outer side of first electrode E1 and form two or more lines at a fixed interval, as illustrated in FIG. 14D to FIG. 14O, it is considered that metal bumps 30Y having the same shape have been arranged neatly in a repeating pattern. In addition, when metal bumps 30Y having the same shape are arranged neatly in a repeating pattern, the load for mounting that is placed on the entire surface of each of first electrode E1 and second electrode E2 can be evenly distributed as compared to the case where metal bumps 30Y having different shapes are arranged. Accordingly, localized stress that metal bumps 30Y give to first electrode E1 and second electrode E2 can be made small, and thus it is possible to reduce damage to first electrode E1 and second electrode E2 that may be caused by metal bumps 30Y.

As described above, with semiconductor device 1 according to the present embodiment, for example, in the case of applying a plating bump technique with high design flexibility for the thickness and the bonding area, it is possible to lessen damage to first electrode E1 of semiconductor element 10 and second electrode E2 of mounting substrate 20 at the time of mounting semiconductor element 10 on mounting substrate 20 by flip-chip bonding. This makes it possible to reduce mounting damage including electrode failures such as damage or peeling of first electrode E1 and second electrode E2 at the time of mounting semiconductor element 10 on mounting substrate 20. Thus, semiconductor device 1 exceptionally reliable in the long run can be obtained.

Note that such semiconductor device 1 exceptionally reliable in the long run is suitable as a compact, highly integrated vehicle-mounted light source with large electric current.

Embodiment 2

Figure 15:
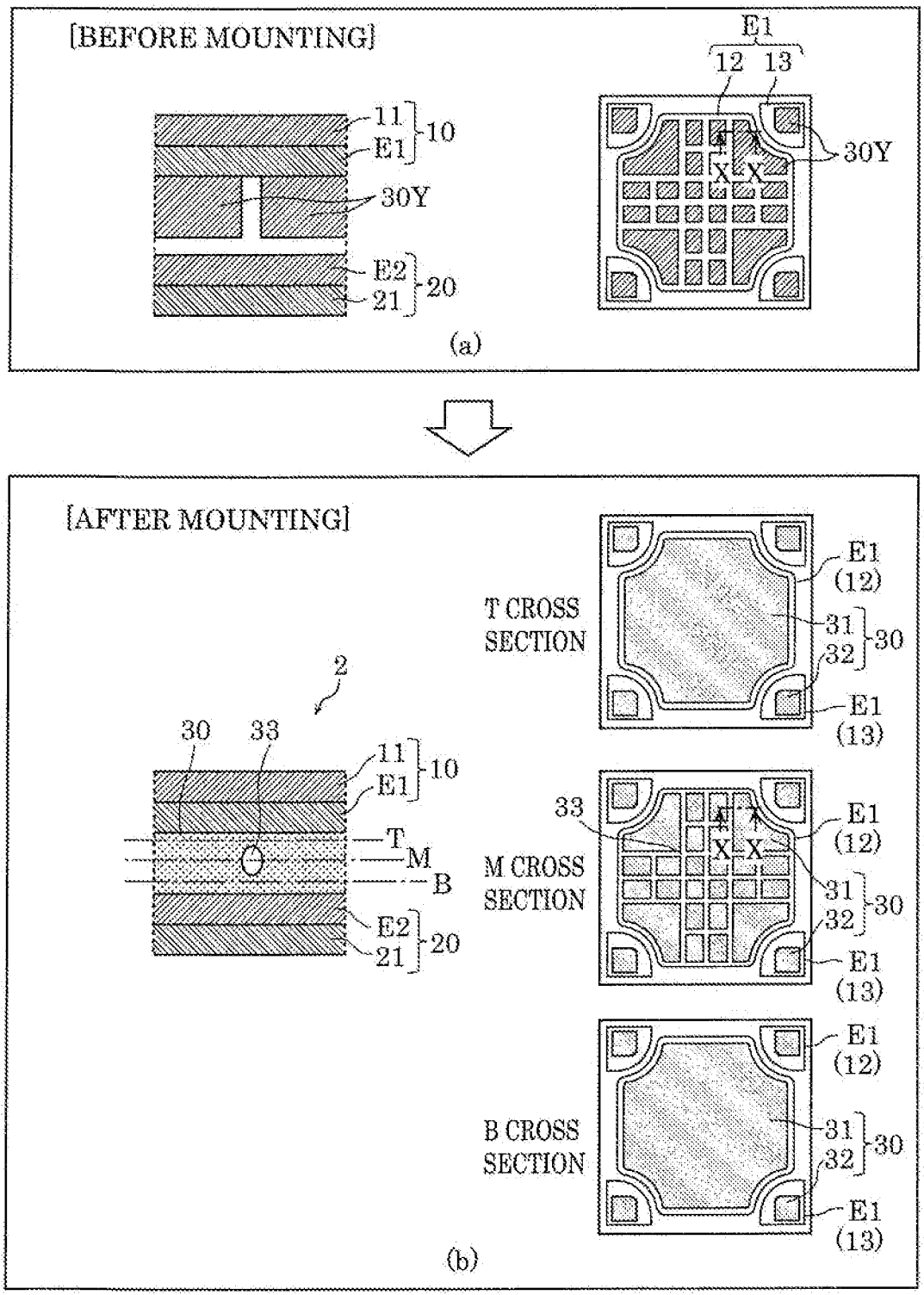
FIG. 15 is a cross-sectional view illustrating the configurations of a semiconductor device according to Embodiment 2 before and after mounting.

Next, semiconductor device 2 according to Embodiment 2 will be described with reference to FIG. 15. FIG. 15 is a cross-sectional view illustrating the configurations of semiconductor device 2 according to Embodiment 2 before and after mounting. In FIG. 15, (a) is a cross-sectional view in which semiconductor element 10 has not yet been mounted on mounting substrate 20, and (b) is a cross-sectional view in which semiconductor element 10 has already been mounted on mounting substrate 20. In (a) and (b) in FIG. 15, the left diagram is a cross-sectional view taken along line X-X in the right diagram.

As illustrated in FIG. 2B, in semiconductor device 1 according to Embodiment 1 described above, the outer side of first electrode E1 of semiconductor element 10 is a straight line only, but, as illustrated in FIG. 15, in semiconductor device 2 according to the present embodiment, the outer side of first electrode E1 of semiconductor element 10 at least partially includes a curved section.

Specifically, in semiconductor device 2 according to the present embodiment, the outer side of first p-side electrode 12 includes arc-shaped curved sections at four corners, and the outer sides of four island-shaped first n-side electrodes 13 on the first p-side electrode 12 side include arc-shaped curved sections.

With the outer side of first electrode E1 being bent in a curve as mentioned above, electric field concentration can be less than that with first electrode E1 being bent at a right angle. Accordingly, electric current concentration can be reduced.

Furthermore, in semiconductor device 2 according to the present embodiment, at the time of mounting semiconductor element 10 having the plurality of metal bumps 30Y formed thereon on mounting substrate 20, the plurality of metal bumps 30Y are deformed and integrated to form bonding metal layer 30 including gap 33 inside, as in semiconductor device 1 according to Embodiment 1 described above.

With this, it is possible to evenly distribute the load for mounting that is placed on first electrode E1 of semiconductor element 10 and second electrode E2 of mounting substrate 20, and thus localized stress that metal bumps 30Y give to first electrode E1 and second electrode E2 at the time of mounting can be made small. As a result, it is possible to reduce damage to first electrode E1 and second electrode E2 that may be caused by metal bumps 30Y. Accordingly, with semiconductor device 2 according to the present embodiment, mounting damage due to electrode failures of first electrode E1 and second electrode E2 can be reduced; therefore, it is possible to provide semiconductor device 2 exceptionally reliable in the long run.

Figure 16:
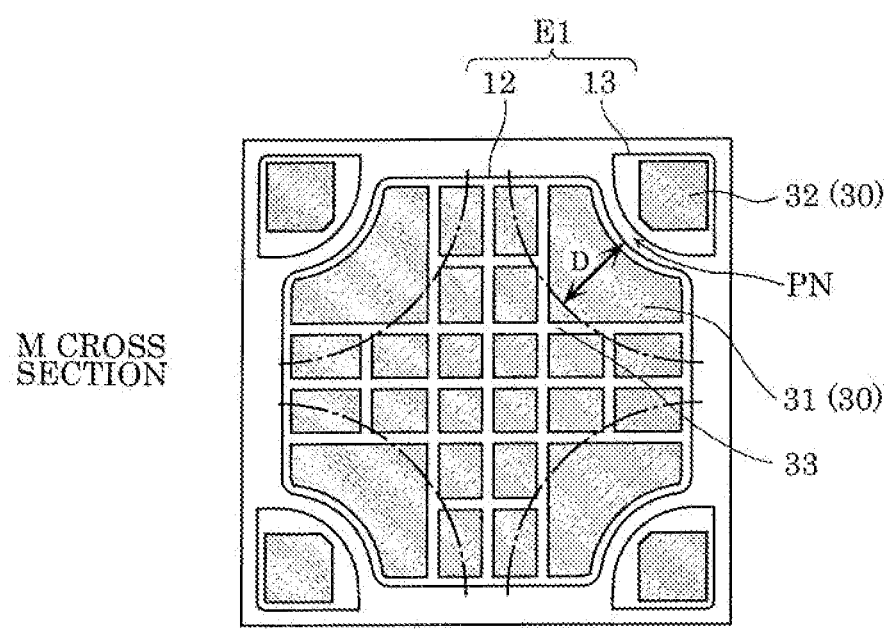
FIG. 16 is an enlarged view of the M cross section in (b) in FIG. 15.

Furthermore, the pattern of gap 33 according to the present embodiment can improve heat dissipation properties. This point will be described below with reference to FIG. 16. FIG. 16 is an enlarged view of the M cross section in (b) in FIG. 15.

As illustrated in FIG. 16, in semiconductor device 2 according to the present embodiment, the proportion of the area taken up by gap 33 in a plan view is lower in a region close to p-n electrode opposed portion PN across which first p-side electrode 12 and first n-side electrode 13 are opposed to each other than in a region away from p-n electrode opposed portion PN. The region close to p-n electrode opposed portion PN is a region located at distance D of between 50 µm and 100 µm, inclusive, from p-n electrode opposed portion PN in the present embodiment.

The amount of heat generated at p-n electrode opposed portion PN is largest; with p-n electrode opposed portion PN as a reference, a region located at distance D of between 50 µm and 100 µm, inclusive, from p-n electrode opposed portion PN becomes a heat-concentrated region.

Here, what is meant by gap 33 in a region close to p-n electrode opposed portion PN having a low area proportion is that metal bump 30Y present in the region close to p-n electrode opposed portion PN, which becomes a heat-concentrated region, is large in size, resulting in high heat conduction.

Thus, with the proportion of the area taken up by gap 33 being lower in a region close to p-n electrode opposed portion PN than in a region away from p-n electrode opposed portion PN, it is possible to obtain semiconductor device 2 having superior heat dissipation properties.

Figure 17:
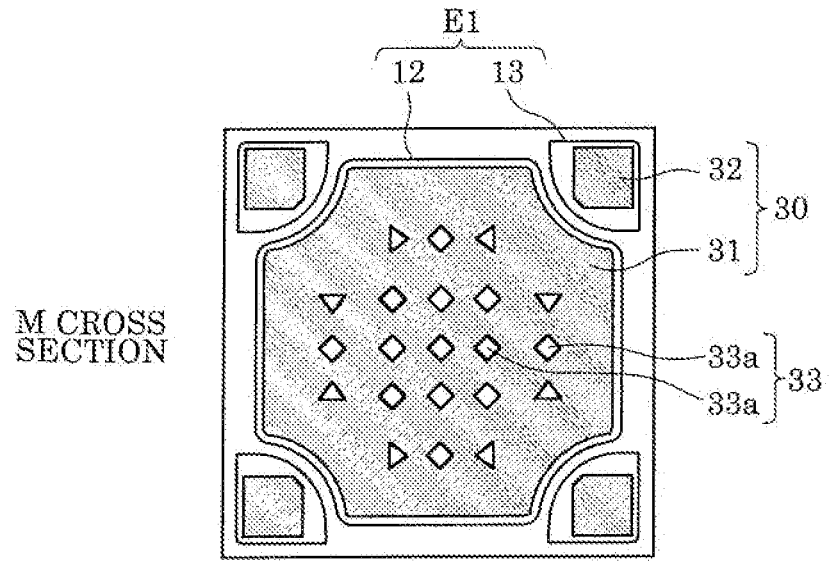
FIG. 17 is a diagram illustrating a gap pattern of a bonding metal layer in a semiconductor device according to Variation 1 of Embodiment 2.

Note that in the present embodiment, gap 33 inside bonding metal layer 30 is a combination of voids in the form of straight lines, but this is not limiting. For example, gap 33 may be made up of a plurality of voids 33a aligned in the form of dots, as illustrated in FIG. 17. Gap 33 illustrated in FIG. 17 is formed by deforming metal bumps 30Y more heavily than when forming gap 33 illustrated in FIG. 16. Specifically, even in the case where a gap between adjacent metal bumps 30Y is linear before mounting, when metal bumps 30Y are deformed intentionally heavily or ended up being deformed too much, gap 33 may be formed into the shape of a dot instead of a line.

Figure 18:
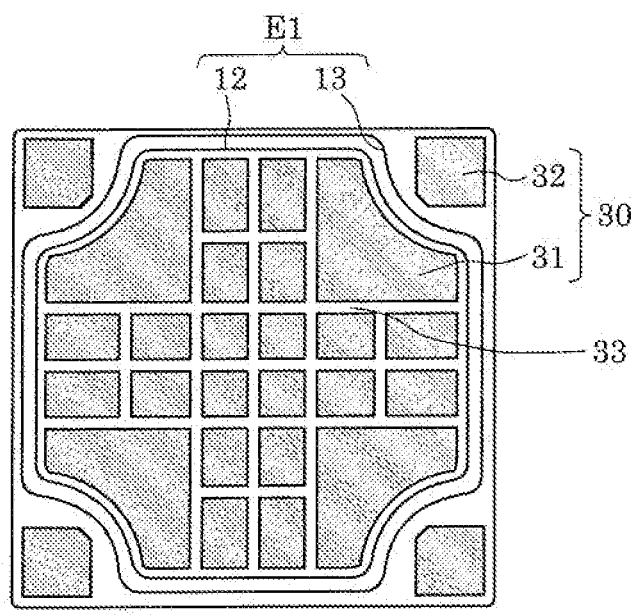
FIG. 18 is a diagram illustrating a gap pattern of a bonding metal layer in a semiconductor device according to Variation 2 of Embodiment 2.

Furthermore, in the present embodiment, first electrode E1 includes four first n-side electrodes 13 in the form of islands, but this is not limiting. For example, first n-side electrode 13 may be provided along the entire perimeter of the electrode forming surface of semiconductor element 10 so as to surround entire first p-side electrode 12, as illustrated in FIG. 18. Note that first n-side electrode 13 in such a pattern may be used in another embodiment.

Variation of Embodiment 2

Figure 19:
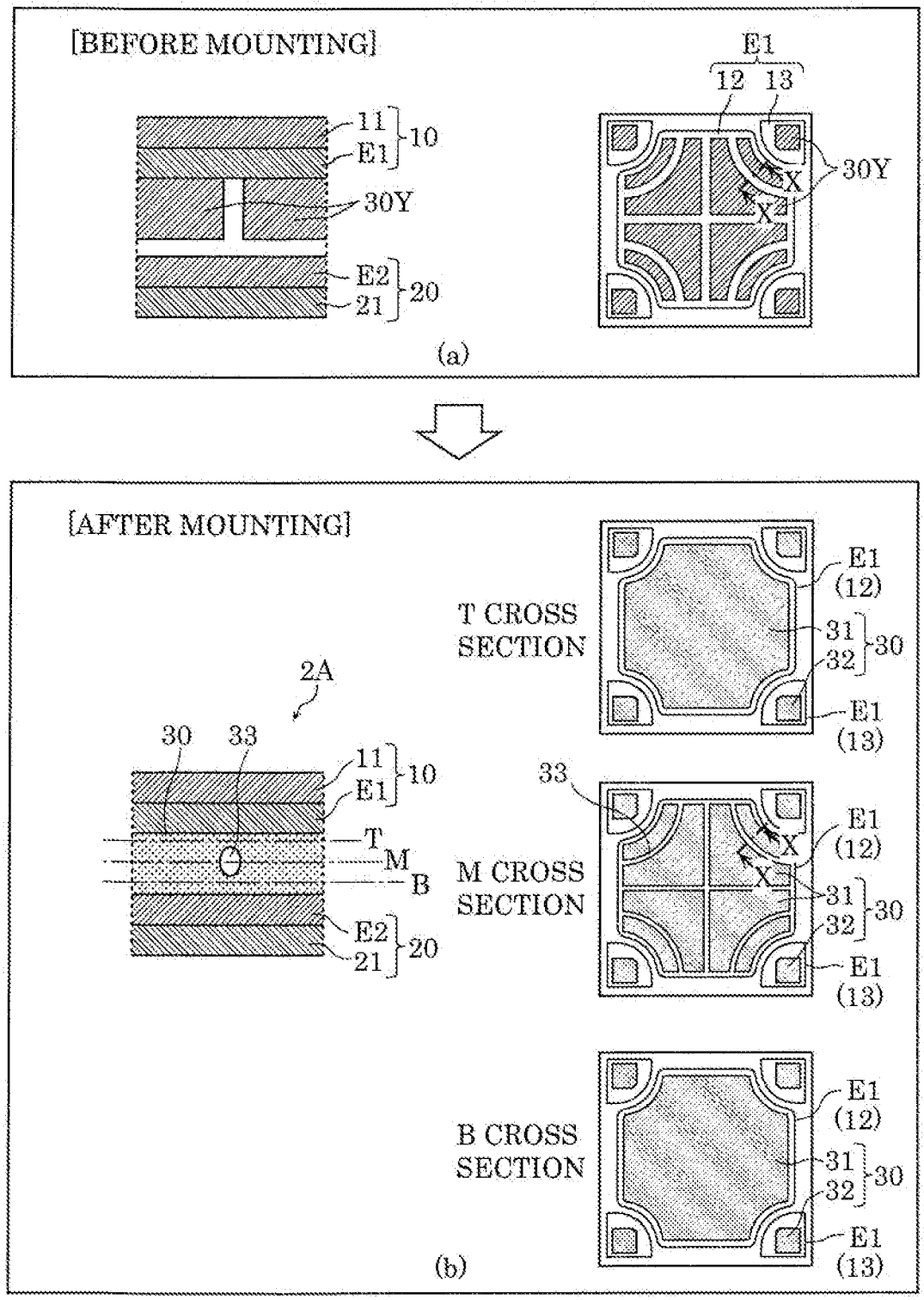
FIG. 19 is a cross-sectional view illustrating the configurations of a semiconductor device according to Variation 3 of Embodiment 2 before and after mounting.

Next, semiconductor device 2A according to a variation of Embodiment 2 will be described with reference to FIG. 19. FIG. 19 is a cross-sectional view illustrating semiconductor device 2A according to the variation of Embodiment 2. In FIG. 19, (a) is a cross-sectional view in which semiconductor element 10 has not yet been mounted on mounting substrate 20, and (b) is a cross-sectional view in which semiconductor element 10 has already been mounted on mounting substrate 20. In (a) and (b) in FIG. 19, the left diagram is a cross-sectional view taken along line X-X in the right diagram.

As illustrated in FIG. 19, in semiconductor device 2A according to the present variation, the outer side of first electrode E1 of semiconductor element 10 at least partially includes a curved section, as in semiconductor device 2 illustrated in FIG. 15.

Furthermore, in semiconductor device 2A according to the present variation, gap 33 inside bonding metal layer 30 extends linearly along the outer side of first electrode E1 in a plan view of bonding metal layer 30. Specifically, gap 33 is in the form of an arc-shaped curve and extends along the curved section provided on the outer side at a corner of first p-side electrode 12.

Thus, when gap 33 of bonding metal layer 30 extends along the outer side of first electrode E1 of semiconductor element 10, it is considered that the plurality of metal bumps 30Y, which become bonding metal layer 30, have been arranged neatly before mounting. When metal bumps 30Y are arranged neatly, the load for mounting that is placed on the entire surface of each of first electrode E1 and second electrode E2 can be evenly distributed as compared to the case where metal bumps 30Y are arranged at random. Accordingly, localized stress that metal bumps 30Y give to first electrode E1 and second electrode E2 can be made small, and thus it is possible to reduce damage to first electrode E1 and second electrode E2 that may be caused by metal bumps 30Y. Thus, semiconductor device 2A exceptionally reliable in the long run can be obtained.

Embodiment 3

Figure 20:
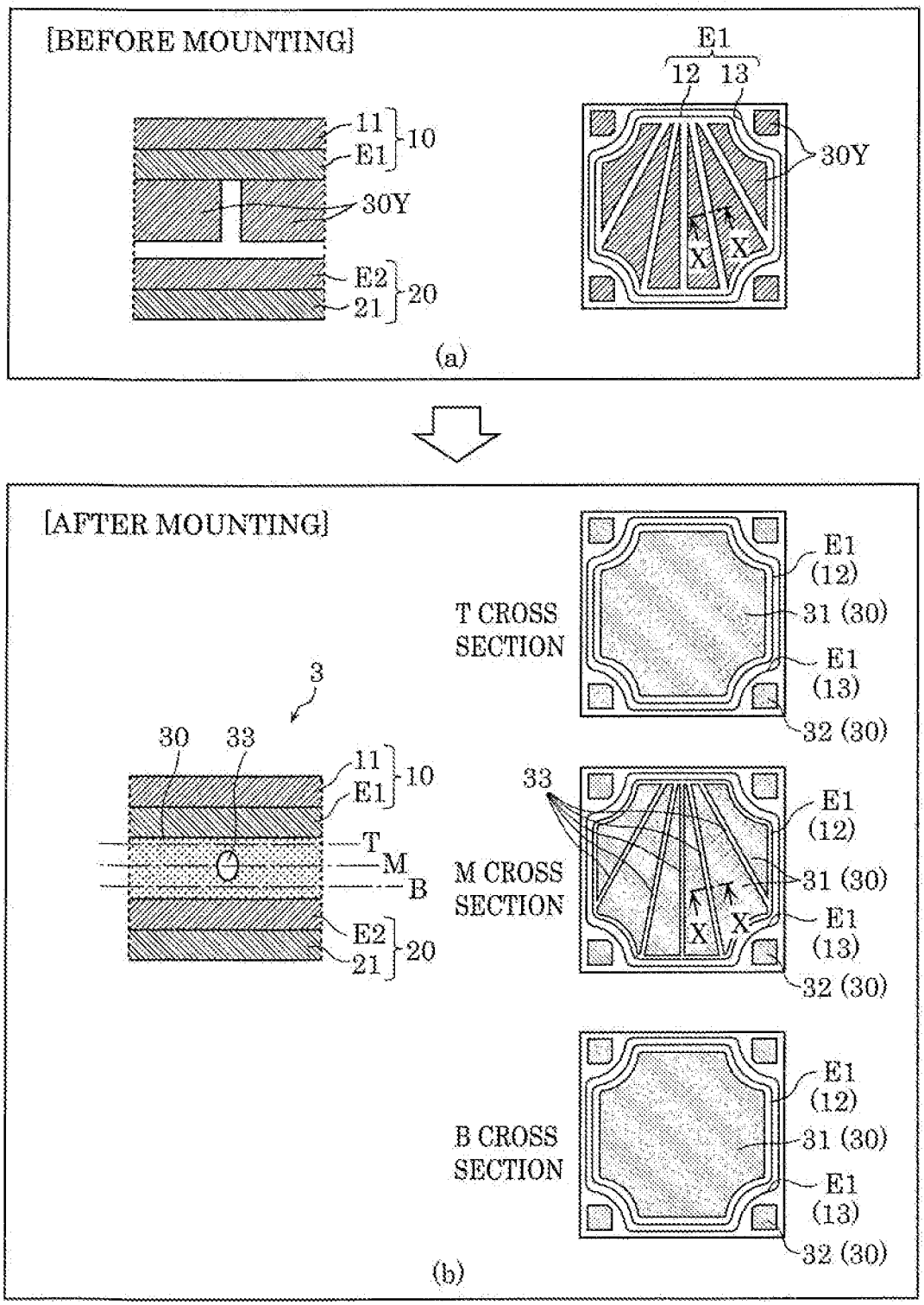
FIG. 20 is a cross-sectional view illustrating the configurations of a semiconductor device according to Embodiment 3 before and after mounting.

Next, semiconductor device 3 according to Embodiment 3 will be described with reference to FIG. 20. FIG. 20 is a cross-sectional view illustrating the configurations of semiconductor device 3 according to Embodiment 3 before and after mounting. In FIG. 20, (a) is a cross-sectional view in which semiconductor element 10 has not yet been mounted on mounting substrate 20, and (b) is a cross-sectional view in which semiconductor element 10 has already been mounted on mounting substrate 20. In (a) and (b) in FIG. 20, the left diagram is a cross-sectional view taken along line X-X in the right diagram.

Semiconductor device 3 according to the present embodiment is different from semiconductor device 2 according to Embodiment 2 described above in that gap 33 inside bonding metal layer 30 has a different shape in a plan view. Specifically, in semiconductor device 3 according to the present embodiment, gap 33 is at least partially radial in shape in a plan view of bonding metal layer 30.

Specifically, as illustrated in the M cross section in FIG. 20, gap 33 is made up of a plurality of voids in the form of straight lines radially extending from a center portion of one side of first p-side electrode 12 of first electrode E1 toward the opposite side.

As described above, in semiconductor device 3 according to the present embodiment, at the time of mounting semiconductor element 10 having the plurality of metal bumps 30Y formed thereon on mounting substrate 20, bonding metal layer 30 is formed by deforming the plurality of metal bumps 30Y so as to include gap 33 inside, as in semiconductor device 2 according to Embodiment 2 described above. Accordingly, mounting damage due to electrode failures of first electrode E1 and second electrode E2 can be reduced; therefore, it is possible to provide semiconductor device 3 exceptionally reliable in the long run.

Furthermore, in semiconductor device 3 according to the present embodiment, gap 33 is at least partially radial in shape. With this, at the time of sealing entire semiconductor device 30 using resin, gap 33 can be easily filled with the resin. This means that gap 33 may be at least partially filled with resin 34 as in semiconductor device 3A illustrated in FIG. 21.

Specifically, since gap 33 is made up of radial voids, when drops of resin 34 in the form of liquid are supplied around semiconductor device 3 to fill the space between semiconductor element 10 and mounting substrate 20 with resin 34 after semiconductor device 10 is mounted on mounting substrate 20, the supplied drops of resin 34 infiltrate into gap 33 radially from one point at which ends of the plurality of radial voids are gathered. Thus, the distance of infiltration of resin 34 can be made shortest, meaning that the occurrence of incomplete filling of gap 33 with resin 34 can be reduced and all the voids included in gap 33 can be easily filled with resin 34, as in semiconductor device 3A illustrated in FIG. 21. Note that after drops of resin 34 in form of liquid are supplied, resin 34 can be thermally cured, for example, by one-hour heating at 150° C.

Resin 34 which fills gap 33 may have thermal conductivity higher than the thermal conductivity of air. For example, a silicone rein can be used a resin 34. Furthermore, microparticles having high thermal conductivity or light-reflective microparticles may be dispersed in resin 34. For example, titanium oxide ($TiO_2$) microparticles can be used as light-reflective microparticles having high thermal conductivity.

In this manner, it is possible to improve the heat dissipation properties of semiconductor device 3 by filling gap 33 with resin 34. Thus, semiconductor device 3 more exceptionally reliable in the long run can be obtained.

Figure 21:
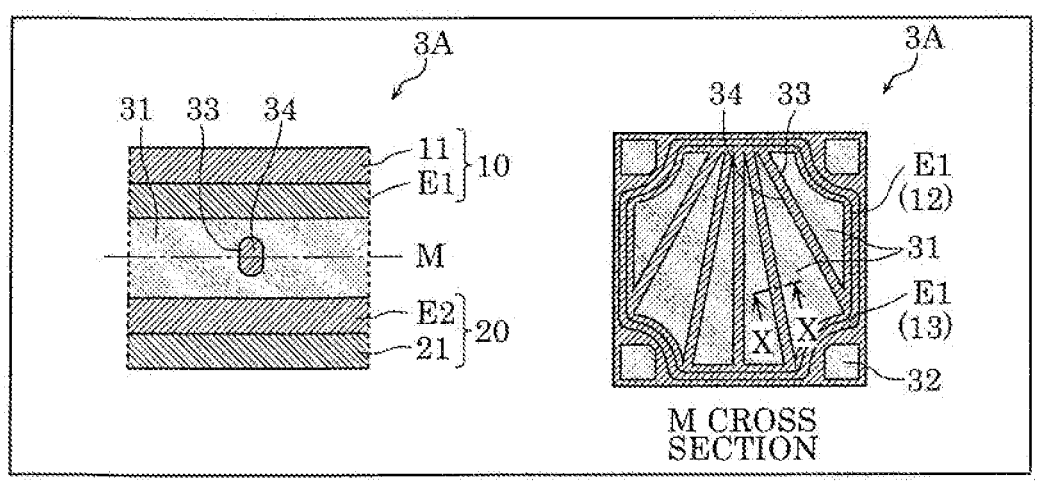
FIG. 21 is a cross-sectional view illustrating the configurations of a semiconductor device according to Variation 1 of Embodiment 3 after mounting.

Note that in FIG. 20 and FIG. 21, gap 33 is made up of the plurality of voids in the form of straight lines radially extending from the center portion of one side of first p-side electrode 12, but this is not limiting.

Figure 22:
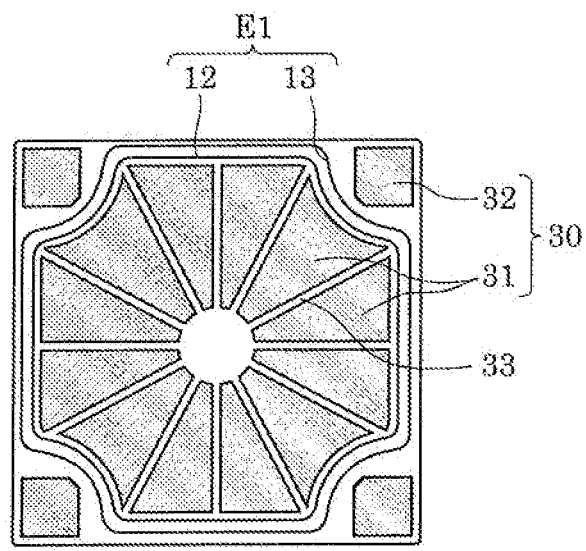
FIG. 22 is a cross-sectional view illustrating the configurations of a semiconductor device according to Variation 2 of Embodiment 3 after mounting.

For example, gap 33 may be made up of a plurality of voids in the form of straight lines radially extending in every direction from the center portion of first p-side electrode 12, as illustrated in FIG. 22. Regarding the pattern of gap 33 illustrated in FIG. 22, as in semiconductor device 2 illustrated in FIG. 15, the proportion of the area taken up by gap 33 is lower in a region close to p-n electrode opposed portion PN than in a region away from p-n electrode opposed portion PN. With this, it is possible to improve heat dissipation properties, and thus semiconductor device 3 yet more exceptionally reliable in the long run can be obtained.

Figure 23:
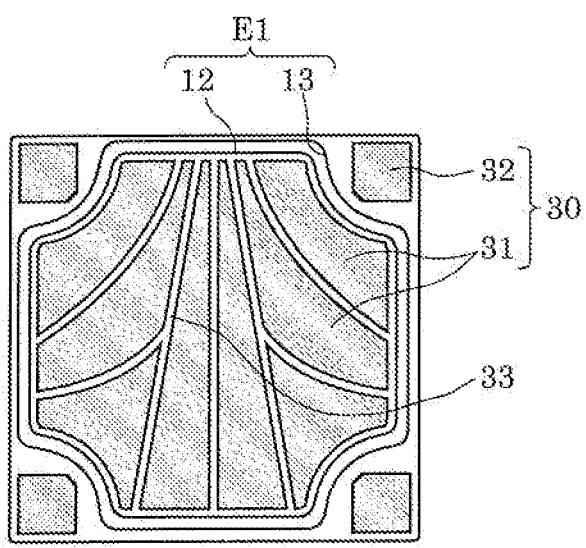
FIG. 23 is a cross-sectional view illustrating the configurations of a semiconductor device according to Variation 3 of Embodiment 3 after mounting.

Furthermore, as illustrated in FIG. 23, gap 33 may include a void branching from a portion of a plurality of radially extending voids or some or all of the plurality of radially extending voids in gap 33 may be curved.

VARIATIONS

Although the semiconductor devices according to the present disclosure have been described based on Embodiments 1 to 3, the present disclosure is not limited to the above-described embodiments.

For example, in each of the above embodiments, first electrode E1 of semiconductor element 10 is configured in such a manner that the electrode area of first p-side electrode 12 is larger than the electrode area of first n-side electrode 13, but this is not limiting. Specifically, the electrode area of first n-side electrode 13 may be larger than the electrode area of first p-side electrode 12. However, in the case where semiconductor element 10 is a LED chip, the p-side tends to have a higher temperature than the n-side, and thus the electrode area of first p-side electrode 12 may be set larger than the electrode area of first n-side electrode 13.

Furthermore, in each of the above embodiments, gap 33 formed inside bonding metal layer 30 is present in only first bonding metal layer 31 among first bonding metal layer 31 and second bonding metal layer 32, but this is not limiting. For example, gap 33 may be present in both first bonding metal layer 31 and second bonding metal layer 32 or may be present in only second bonding metal layer 32 among first bonding metal layer 31 and second bonding metal layer 32. In this case, regarding the plurality of metal bumps 30Y for forming gap 33, the plurality of metal bumps 30Y may be provided on only the p side as in each of the above embodiments, but the plurality of metal bumps 30Y may be provided on both the n side and the p side or may be provided on only the n side.

Furthermore, in each of the above embodiments, the shape, the number, etc., of gaps 33, 33A to 33O are not particularly limited. Moreover, the vertical positions of gaps 33, 33A to 33O are not particularly limited. For example, in the case where the gap is made up of a plurality of voids aligned in the form of dots in a plan view, the voids in each place may be in layers in the thickness direction of bonding metal layer 30.

Furthermore, although the LED chip is exemplified as semiconductor element 10 in each of the above embodiments, this is not limiting; other solid-state light-emitting elements such as a laser element may be used. In addition, semiconductor element 10 is not limited to a light-emitting element. For example, semiconductor element 10 may be a power semiconductor element such as a compound field effect transistor using GaN, SiC, or the like.

Note that forms obtained by various modifications to the above-described embodiments that can be conceived by a person of skill in the art as well as forms realized by arbitrarily combining structural elements and functions in the embodiments which are within the scope of the essence of the present disclosure are included in the present disclosure.

INDUSTRIAL APPLICABILITY

The semiconductor device according to the present disclosure is exceptionally reliable in the long run and is useful for various devices including vehicle-mounted application.

What is claimed is:

1. A semiconductor device, comprising:
   a first electrode provided on a semiconductor multilayer structure;
   a second electrode provided on a substrate; and
   a bonding metal layer that directly bonds the first electrode and the second electrode together, wherein
   the bonding metal layer includes a gap inside, the gap is embedded in the bonding metal layer without contacting the first electrode and the second electrode, and the gap having a shape which includes an angular portion including a corner portion,
   the first electrode includes a p-side electrode and an n-side electrode, a portion across which the p-side and the n-side electrode are opposed each is a p-n electrode opposed portion, and
   in plan view, a proportion of an area within the bonding metal layer taken up by the gap in a region close to the p-n electrode opposed portion is lower than a proportion of an area within the bonding metal layer taken up by the gap in a region away from the p-n electrode opposed portion.

2. The semiconductor device according to claim 1, wherein the region close to the p-n electrode opposed portion is a region located at a distance of 100 µm or less from the p-n electrode opposed portion.

3. The semiconductor device according to claim 1, wherein the gap extends linearly along an outer side of the first electrode in a plan view of the bonding metal layer.

4. The semiconductor device according to claim 3, wherein the gap is parallel to the outer side of the first electrode.

5. The semiconductor device according to claim 1, wherein the gap includes a plurality of lines of gaps at a fixed interval in a plan view.

6. The semiconductor device according to claim 1, wherein the gap comprises a plurality of voids.

7. The semiconductor device according to claim 3, wherein, in a plan view,
   the outer side at least partially includes a curved section, and
   the gap extends along the curved section.

8. The semiconductor device according to claim 1, wherein the gap is at least partially radial in shape in a plan view of the bonding metal layer.

9. The semiconductor device according to claim 1, wherein the gap has a height that is at least 10 percent of a height of the bonding metal layer.

10. The semiconductor device according to claim 1, wherein the gap is at least partially filled with resin.

11. The semiconductor device according to claim 1, wherein the bonding metal layer comprises gold.

* * * * *